US012593599B2

(12) United States Patent
Park et al.

(10) Patent No.:  US 12,593,599 B2
(45) Date of Patent:       Mar. 31, 2026

(54) DISPLAY DEVICE AND METHOD OF MANUFACTURING THE SAME

(71) Applicant: Samsung Display Co., Ltd., Yongin-si (KR)

(72) Inventors: Sungjune Park, Suwon-si (KR); Sung Chul Choi, Hwaseong-si (KR); Sunhaeng Cho, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 502 days.

(21) Appl. No.: 18/096,241

(22) Filed: Jan. 12, 2023

(65) Prior Publication Data

US 2023/0309363 A1      Sep. 28, 2023

(30) Foreign Application Priority Data

Feb. 7, 2022    (KR) ........................ 10-2022-0015397

(51) Int. Cl.
| | |
|---|---|
| *H05K 7/20* | (2006.01) |
| *H10K 59/12* | (2023.01) |
| *H10K 59/80* | (2023.01) |
| *H10K 59/90* | (2023.01) |
| *H10K 102/00* | (2023.01) |

(52) U.S. Cl.
CPC ....... *H10K 59/873* (2023.02); *H10K 59/1201* (2023.02); *H10K 59/90* (2023.02); *H10K 2102/311* (2023.02)

(58) Field of Classification Search
CPC ............... G06F 1/1641; G06F 1/1652; H10K 2102/311
See application file for complete search history.

(56) References Cited

U.S. PATENT DOCUMENTS

| | | | |
|---|---|---|---|
| 10,388,713 B2 | 8/2019 | Son et al. | |
| 10,847,746 B2 | 11/2020 | Lee | |
| 10,910,589 B2* | 2/2021 | Jeong ................... | H10K 77/111 |
| 11,143,891 B2 | 10/2021 | Lee et al. | |
| 11,223,020 B2* | 1/2022 | Zhang ................. | H01L 23/5387 |
| 11,665,955 B2 | 5/2023 | Park et al. | |
| 2016/0179229 A1* | 6/2016 | Ahn ................... | H10K 59/1213 345/173 |

(Continued)

FOREIGN PATENT DOCUMENTS

| | | |
|---|---|---|
| KR | 1020190124839 A | 11/2019 |
| KR | 1020200002047 A | 1/2020 |

(Continued)

*Primary Examiner* — Anthony Q Edwards
(74) *Attorney, Agent, or Firm* — CANTOR COLBURN LLP

(57) ABSTRACT

A display device includes a display panel including a first area, a second area, and a bending area disposed between the first area and the second area and having a predetermined radius of curvature, a first protective member including a first coupling layer disposed under the display panel in the first area and a first protective layer disposed under the first coupling layer, and a second protective member disposed under the display panel in the second area. The first protective member has a first thickness different from a second thickness of the second protective member. Accordingly, the display device is easily bent.

13 Claims, 12 Drawing Sheets

(56)                    References Cited

U.S. PATENT DOCUMENTS

| | | | |
|---|---|---|---|
| 2016/0181346 A1* | 6/2016 | Kwon .................. | H10D 86/441 |
| | | | 257/40 |
| 2020/0092407 A1* | 3/2020 | Fournier .............. | G06F 1/1637 |
| 2021/0202460 A1* | 7/2021 | Shin ........................ | H01L 25/18 |
| 2023/0123422 A1* | 4/2023 | Bi ........................ | G06F 1/1652 |
| | | | 361/807 |

FOREIGN PATENT DOCUMENTS

| | | |
|---|---|---|
| KR | 1020210145094 A | 12/2021 |
| KR | 1020220009544 A | 1/2022 |

* cited by examiner

DR3

DISPLAY DEVICE AND METHOD OF MANUFACTURING THE SAME

This application claims priority to Korean Patent Application No. 10-2022-0015397, filed on Feb. 7, 2022, and all the benefits accruing therefrom under 35 U.S.C. § 119, the content of which in its entirety is herein incorporated by reference.

BACKGROUND

1. Field

The disclosure relates to a display device and a method of manufacturing the same. More particularly, the disclosure relates to a display device including a protective member for a display panel, which is easily bent, and a method of manufacturing the display device.

2. Description of the Related Art

A display device includes an active area activated in response to electrical signals. The display device senses inputs applied thereto through the active area from the outside and displays various images to provide a user with information. In recent years, as display devices having various shapes are developed, active areas are being implemented to have a variety of shapes.

SUMMARY

The disclosure provides a display device including a protective member for a display panel, which is easily bent.

The disclosure provides a method of manufacturing the display device.

An embodiment of the disclosure provides a display device including a display panel including a first area, a second area, and a bending area that is disposed between the first area and the second area and is able to be bent, a first protective member including a first coupling layer disposed under the display panel in the first area and a first protective layer disposed under the first coupling layer, and a second protective member disposed under the display panel in the second area. The first protective member has a first thickness different from a second thickness of the second protective member.

In an embodiment, the second protective member may include a material different from a material of the first protective member.

In an embodiment, the display device may further include a support member disposed under the second protective member.

In an embodiment, the display device may further include a driving circuit disposed in the first area of the display panel.

In an embodiment, the first protective layer may include polyethylene terephthalate ("PET"). The first coupling layer may include a pressure sensitive adhesive ("PSA").

In an embodiment, the second protective member may include a second protective layer disposed in the second area. The second protective layer may include a material different from a material of the first protective layer. The second protective layer may have a modulus smaller than a modulus of the first protective layer. The second protective layer may have a glass transition temperature higher than a glass transition temperature of the first protective layer.

In an embodiment, the second protective member may include a second coupling layer disposed in the second area and a second protective layer disposed under the second coupling layer. The second coupling layer may include a material different from a material of the first coupling layer. The second coupling layer may include a PSA.

An embodiment of the disclosure provides a method of manufacturing a display device. The manufacturing method of the display device includes preparing a preliminary display module including a first protective layer attached to a first lower surface of the display panel in the first area using a first coupling layer and a preliminary protective layer attached to a second lower surface of the display panel in the second area using a preliminary coupling layer, irradiating a light to the preliminary coupling layer to remove the preliminary protective layer from the second lower surface, and forming a second protective layer under the display panel in the second area. The preliminary protective layer includes a first material different from a second material of the second protective layer.

In an embodiment, the first protective layer may include a third material different from the second material.

In an embodiment, the light may be an ultraviolet ray.

In an embodiment, the preliminary coupling layer may have an adhesion equal to or greater than about 300 grams force per inch (gf/inch) and equal to or smaller than about 1000 gf/inch with respect to the second lower surface in the preparing the preliminary display module.

In an embodiment, the preliminary coupling layer may have an adhesion equal to or greater than about 1 gf/inch and equal to or smaller than about 20 gf/inch with respect to the second lower surface in the removing the preliminary protective layer from the second lower surface.

In an embodiment, the forming the second protective layer in the second area may include attaching the second protective layer to the second lower surface using a second coupling layer.

In an embodiment, the second coupling layer may include a material different from a material of the preliminary coupling layer.

According to the above, the material and the thickness of the protective member of the display panel in the display area may be different from those of the protective member of the display panel in the non-display area. Thus, the display panel may be easily bent in the display area, and the display panel is not deformed in the non-display area even though an out lead bonding ("OLB") process is performed. As the process of replacing the protective member may be carried out to form the protective member in the display area, a decrease in process efficiency is prevented.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION

Figure 1A:
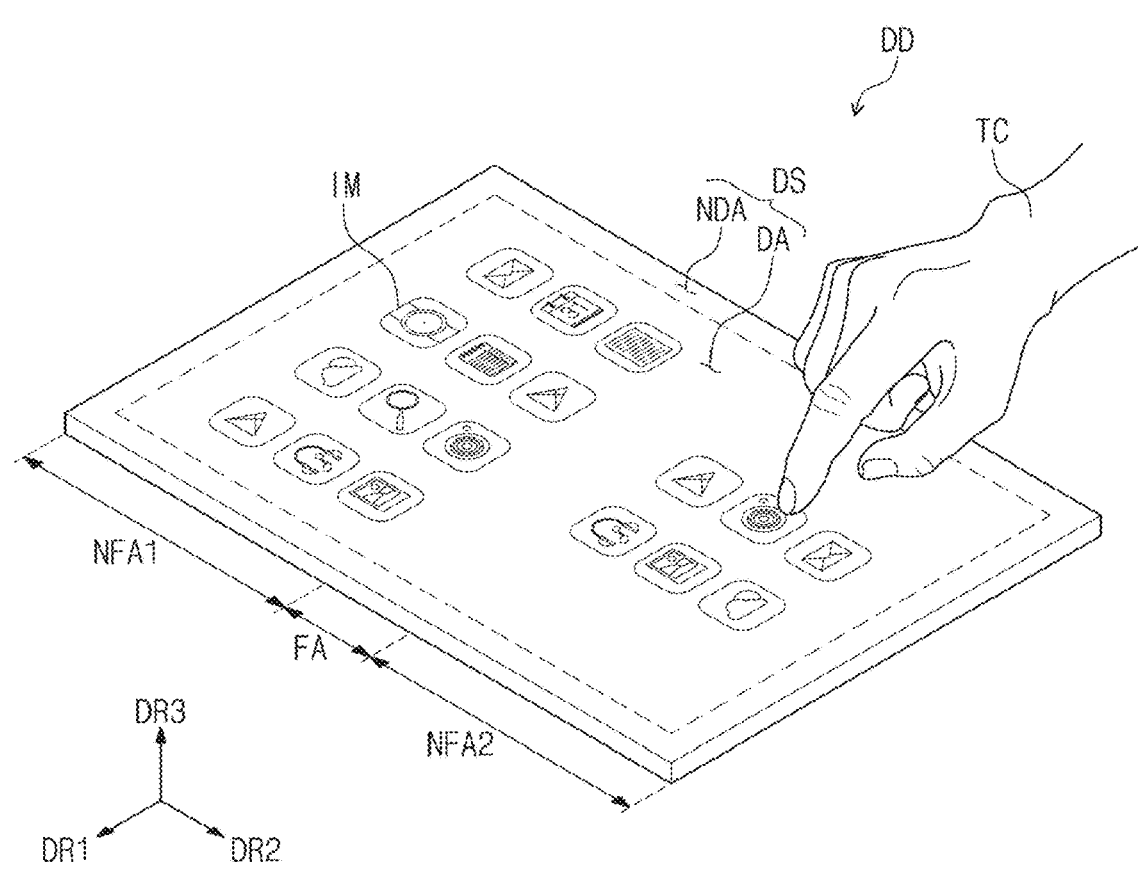
FIGS. 1A and 1B are perspective views of an embodiment of a display device according to the disclosure.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the drawing figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

In the disclosure, when an element is also referred to as being "directly disposed" to another element, there are no intervening elements between a layer, film region, or substrate and another layer, film, region, or substrate. In an embodiment, the term "directly disposed" may mean that two layers or two members are disposed without employing additional adhesive therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to accompanying drawings.

Figure 1B:
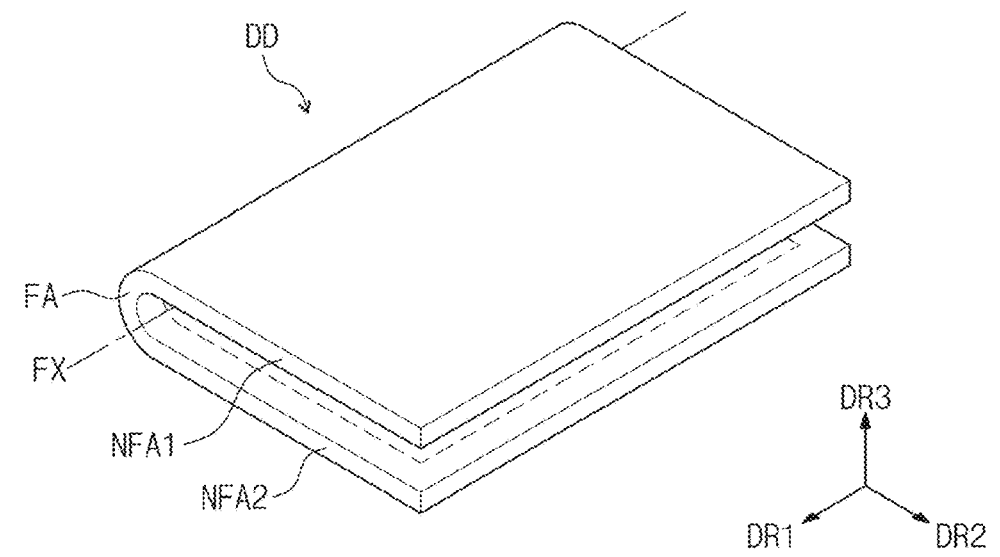

FIG. 1A is a perspective view of an embodiment of a display device DD according to the disclosure. FIG. 1B is a perspective view of an embodiment of the display device DD according to the disclosure. FIG. 1A shows the display device DD in an unfolded state, and FIG. 1B shows the display device DD in a folded state.

Referring to FIGS. 1A and 1B, the display device DD may be a foldable display device. The display device DD in the embodiment of the disclosure may be applied to a large-sized electronic item, such as a television set or a monitor, or a small and medium-sized item, such as a mobile phone, a tablet computer, a car navigation unit, a game unit, or a smart watch.

An upper surface of the display device DD may be defined as a display surface DS, and the display surface DS may have a plane surface defined by a first direction DR1 and a second direction DR2 in an unfolded state, i.e., in a flat state of the display device DD. A thickness direction of the display device DD may be substantially parallel to a third direction DR3. Accordingly, front (or upper) and rear (or lower) surfaces of each member of the display device DD may be distinguished from each other with respect to the third direction DR3.

The display surface DS may include a display area DA and a non-display area NDA defined around the display area DA. An image IM is displayed through the display area DA, and the image IM is not displayed through the non-display area NDA. FIG. 1A shows a plurality of application icons as representative embodiments of the image IM.

The display area DA may have a quadrangular shape. The non-display area NDA may surround the display area DA. However, they should not be limited thereto or thereby, and the shape of the display area DA and the shape of the non-display area NDA may be designed relative to each other.

The display device DD may sense a user input TC applied thereto from the outside. The user input TC may include various types of external inputs, such as a part of a body of a user, light, heat, or pressure. In the illustrated embodiment, the user input TC is shown as a hand of a user being applied to the display surface DS, however, this is merely one of embodiments. As described above, the user input TC may be provided in various forms, e.g., an input generated by the hand of the user, an input generated by a device, such as a touch pen, a stylus pen, etc. In addition, the display device DD may sense the user input TC applied to a side or rear surface of the display device DD depending on its structure, however, it should not be limited to a particular embodiment.

The display device DD may activate the display surface DS to display the image IM and to sense the user input TC. In the illustrated embodiment, an area in which the user input TC is sensed may be defined in the display area DA in which the image IM is displayed, however, this is merely one of embodiments. In an embodiment, an area in which the user input TC is sensed may be defined in the non-display area NDA or may be defined in an entirety of an area of the display surface DS.

The display device DD may include a first non-folding area NFA1, a folding area FA, and a second non-folding area NFA2, which are sequentially defined therein along the second direction DR2. That is, the folding area FA may be defined between the first non-folding area NFA1 and the second non-folding area NFA2. FIGS. 1A and 1B show one folding area FA and two non-folding areas, e.g., the first and second non-folding areas NFA1 and NFA2, however, the number of the folding areas and the number of the non-folding areas should not be limited thereto or thereby. In an embodiment, the display device DD may include three or more non-folding areas and folding areas disposed between the non-folding areas, for example.

The display device DD may be folded about a folding axis FX. That is, the folding area FA may be folded about the folding axis FX. The folding axis FX may extend in the first direction DR1. The folding axis FX may be defined as a minor axis substantially parallel to short sides of the display device DD.

When the display device DD is folded, the display surface corresponding to the first non-folding area NFA1 and the display surface corresponding to the second non-folding area NFA2 may face each other. Accordingly, the display surface DS may not be exposed to the outside in the folded state, however, this is merely one of embodiments. In an embodiment of the disclosure, when the display device DD is folded, the display surface corresponding to the first non-folding area NFA1 and the display surface corresponding to the second non-folding area NFA2 may face directions opposite to each other. Accordingly, the display surface DS may be exposed to the outside in the folded state.

Figure 2A:
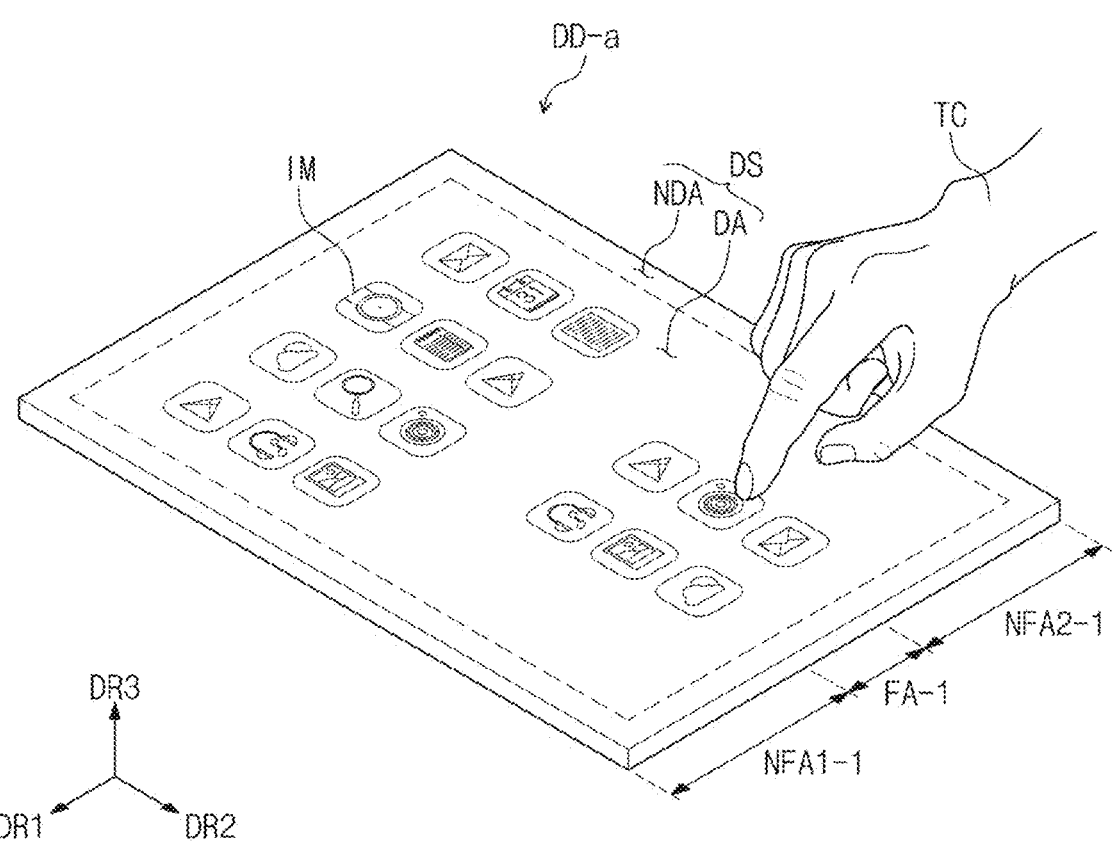
FIGS. 2A and 2B are perspective views of an embodiment of a display device according to the disclosure.
Figure 2B:
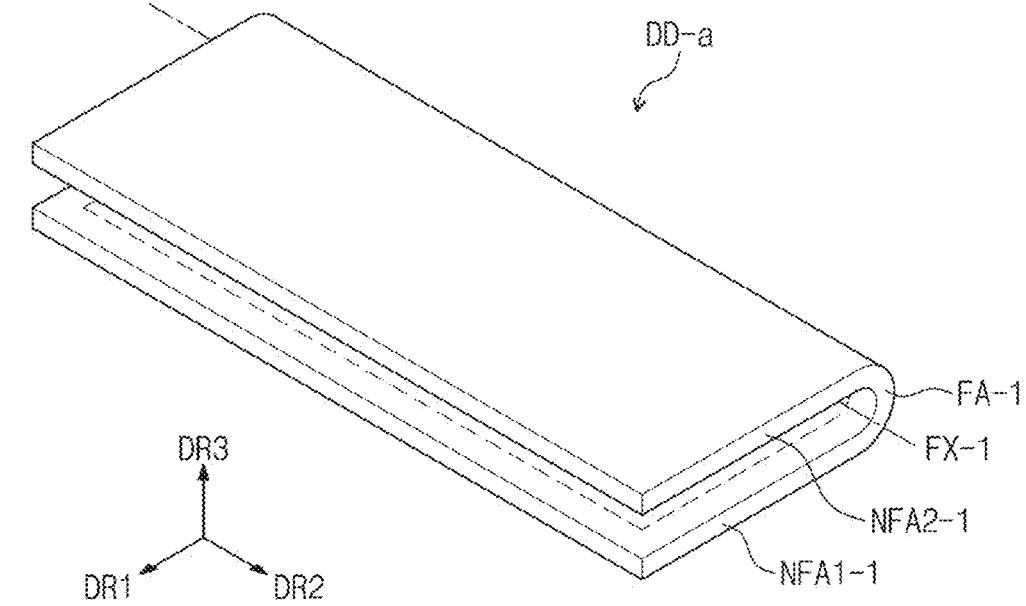

FIG. 2A is a perspective view of an embodiment of a display device DD-a according to the disclosure. FIG. 2B is a perspective view of an embodiment of the display device DD-a according to the disclosure. FIG. 2A shows the display device DD-a in an unfolded state, and FIG. 2B shows the display device DD-a in a folded state.

Referring to FIGS. 2A and 2B, the display device DD-a may include a first non-folding area NFA1-1, a folding area FA-1, and a second non-folding area NFA2-1, which are sequentially defined therein along a direction opposite to the first direction DR1. That is, the folding area FA-1 may be defined between the first non-folding area NFA1-1 and the second non-folding area NFA2-1.

The display device DD-a may be folded about a folding axis FX-1. That is, the folding area FA-1 may be folded about the folding axis FX-1. The folding axis FX-1 may extend in the second direction DR2. The folding axis FX-1 may be defined as a major axis substantially parallel to long sides of the display device DD-a.

Hereinafter, a structure of the display device DD folded about the minor axis will be described in detail, however, structures described below may be applied to the display device DD-a that is folded about the major axis.

Figure 3:
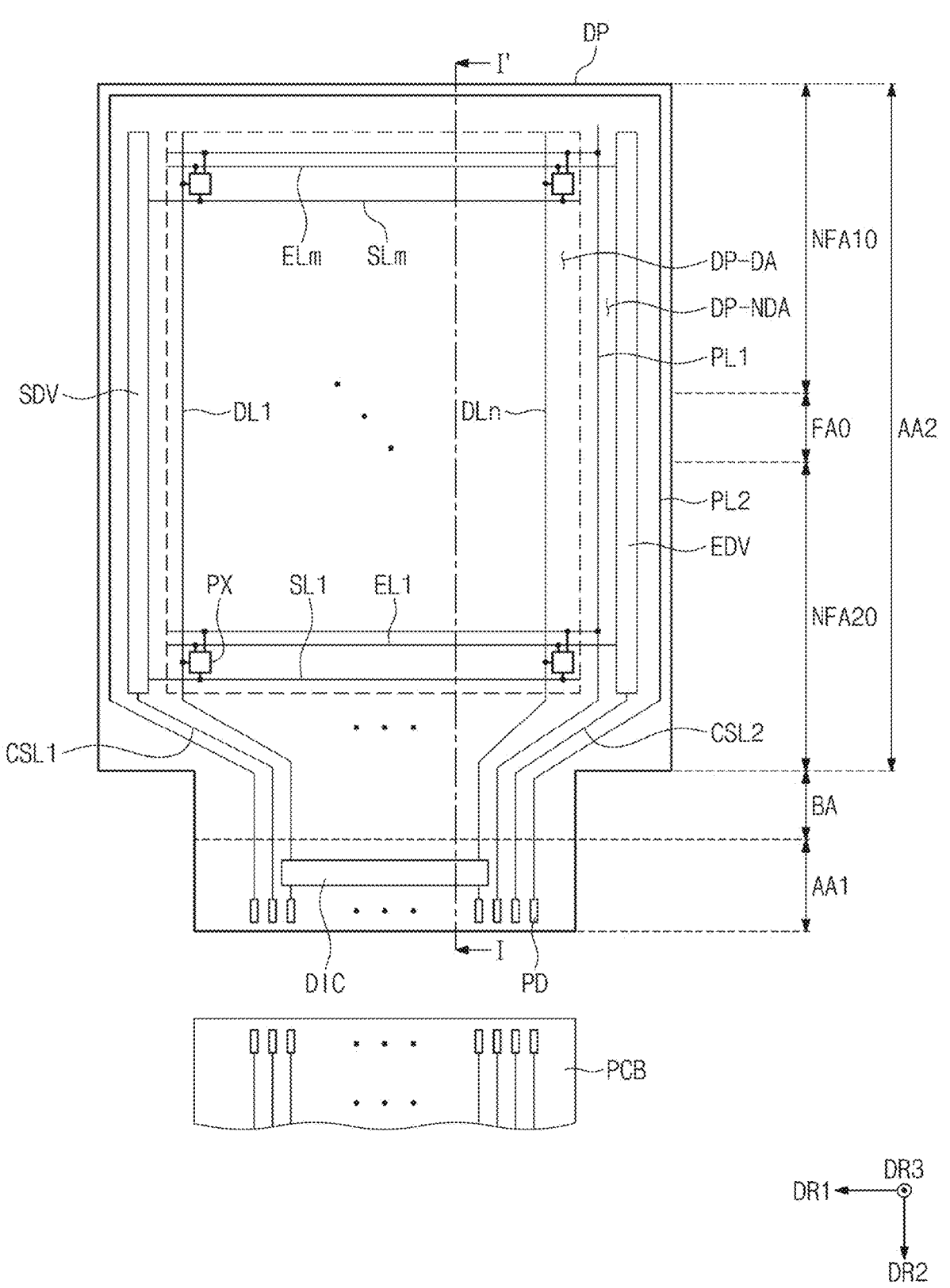
FIG. 3 is a plan view of an embodiment of a display panel according to the disclosure.
Figure 4:
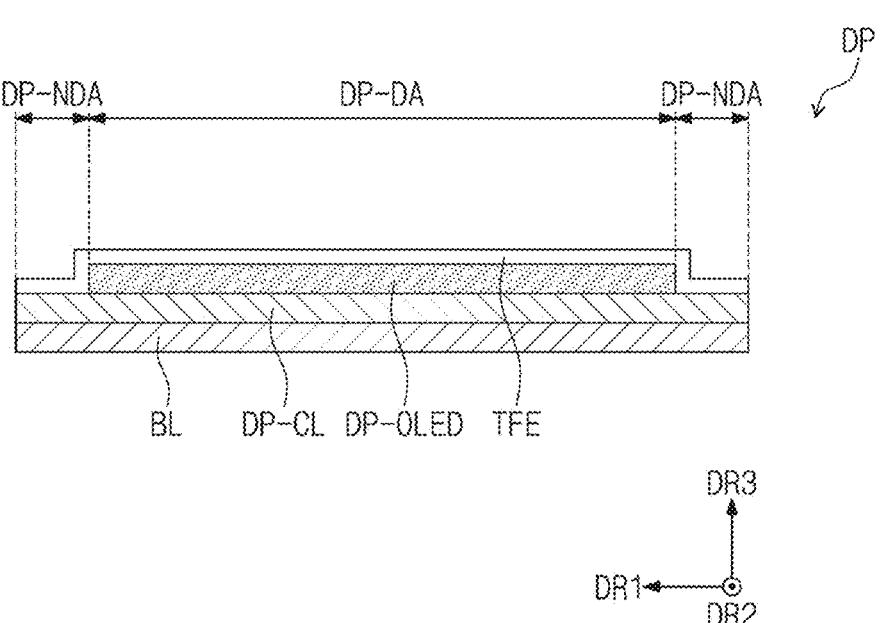
FIG. 4 is a cross-sectional view of an embodiment of a display panel according to the disclosure.

FIG. 3 is a plan view of an embodiment of a display panel DP according to the disclosure. FIG. 4 is a cross-sectional view of an embodiment of the display panel DP according to the disclosure.

The display panel DP may be a light-emitting type display panel, however, it should not be particularly limited. For instance, the display panel DP may be an organic light-emitting display panel or a quantum dot light-emitting display panel. A light-emitting layer of the organic light-emitting display panel may include an organic light-emitting material. A light-emitting layer of the quantum dot light-emitting display panel may include a quantum dot or a quantum rod. Hereinafter, the organic light-emitting display panel will be described as an illustrative embodiment of the display panel DP.

Referring to FIG. 3, the display panel DP may include a display area DP-DA and a non-display area DP-NDA around the display area DP-DA. The display area DP-DA and the non-display area DP-NDA may be distinguished from each other by the presence or absence of a pixel PX. The display area DP-DA and the non-display area DP-NDA may respectively correspond to the display area DA and the non-display area NDA of FIG. 1A. In the disclosure, the expression "an area/portion corresponds to another area/portion" means that "an area/portion overlaps another area/portion", but the expression should not be limited to "an area/portion has the same area and/or the same shape as another area/portion". A scan driver SDV, a driving circuit DIC, and an emission driver EDV may be disposed in the non-display area DP-NDA.

The display panel DP may include a first area AA1, a second area AA2, and a bending area BA, which are distinct from each other in the second direction DR2. When the display device DD is completely manufactured as shown in FIG. 1A, the first area AA1 and the second area AA2 of the display panel DP may be disposed in different planes from each other. This is as shown in FIG. 6B. The bending area BA may be defined between the first area AA1 and the second area AA2. A bent shape of the bending area BA will be described later with reference to FIG. 6B. FIG. 3 shows the display panel DP in a state in which the bending area BA is not bent before the manufacturing of the display device DD is completed.

The second area AA2 may be an area corresponding to the display surface DS of FIG. 1A. The second area AA2 may include a first non-folding area NFA10, a second non-folding area NFA20, and a folding area FAO. The first non-folding area NFA10, the second non-folding area NFA20, and the folding area FAO may respectively correspond to the first non-folding area NFA1, the second non-folding area NFA2, and the folding area FA of FIGS. 1A and 1B.

A width, in the first direction DR1, of each of the bending area BA and the first area AA1 may be smaller than a width, in the first direction DR1, of the second area AA2. The first area AA1 and the bending area BA may be portions of the non-display area DP-NDA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, and a plurality of pads PD. In the illustrated embodiment, each of m and n may indicate a natural number equal to or greater than 2. The pixels PX may be connected to the scan lines SL1 to SLm, the data lines DL1 to DLn, and the emission lines EL1 to ELm.

The driving circuit DIC may be disposed in the first area AA1. The driving circuit DIC may be an integrated circuit chip. The scan lines SL1 to SLm may extend in the first direction DR1 and may be connected to the scan driver SDV. The data lines DL1 to DLn may extend in the second direction DR2 and may be connected to the driving circuit DIC via the bending area BA. The emission lines EL1 to ELm may extend in the first direction DR1 and may be connected to the emission driver EDV.

The first power line PL1 may include a portion extending in the first direction DR1 and a portion extending in the second direction DR2. The portion extending in the second direction DR2 and the portion extending in the first direction DR1 may be disposed in different layers from each other. The portion of the first power line PL1, which extends in the second direction DR2, may extend to the first area AA1 via the bending area BA. The first power line PL1 may provide a first voltage to the pixels PX.

The second power line PL2 may be disposed in the non-display area DP-NDA along an edge of the second area AA2. The second power line PL2 may be disposed outside the scan driver SDV and the emission driver EDV.

The first control line CSL1 may be connected to the scan driver SDV and may extend to a lower end of the first area AA1 via the bending area BA. The second control line CSL2 may be connected to the emission driver EDV and may extend to the lower end of the first area AA1 via the bending area BA.

In a plan view, the pads PD may be disposed adjacent to the lower end of the first area AA1. The driving circuit DIC, the first power line PL1, the second power line PL2, the first control line CSL1, and the second control line CSL2 may be connected to the pads PD. A printed circuit board PCB may be electrically connected to the pads PD through an anisotropic conductive adhesive layer.

Each of the pixels PX may include a light-emitting element and a pixel driving circuit controlling an emission of the light-emitting element. The pixel driving circuit may include a plurality of transistors and at least one capacitor.

Referring to FIG. 4, the display panel DP may include a base layer BL, a circuit element layer DP-CL disposed on the base layer BL, a display element layer DP-OLED disposed on the circuit element layer DP-CL, and a thin film encapsulation layer TFE disposed on the display element layer DP-OLED.

The base layer BL may include a synthetic resin film. In an embodiment, the base layer BL may include polyimide ("PI"). The base layer BL may have a multi-layer structure. The base layer BL may include a first synthetic resin film, at least one inorganic layer disposed on the first synthetic resin film, and a second synthetic resin film disposed on the inorganic layer. Each of the first synthetic resin film and the second synthetic resin film may be a polyimide film.

The circuit element layer DP-CL may include an organic layer, an inorganic layer, a semiconductor pattern, a conductive pattern, and a signal line. The organic layer, the inorganic layer, a semiconductor layer, and a conductive layer may be formed on the base layer BL by a coating or depositing process. Then, the organic layer, the inorganic layer, the semiconductor layer, and the conductive layer may be selectively patterned through several photolithography processes, and thus, the semiconductor pattern, the conductive pattern, and the signal line may be formed.

The semiconductor pattern, the conductive pattern, and the signal line may form the pixel driving circuit of pixels PX and the signal lines SL1 to SLm, DL1 to DLn, EL1 to ELm, CSL1, CSL2, PL1, and PL2 described with reference to FIG. 3. The pixel driving circuit may include at least one transistor.

The display element layer DP-OLED may include the light-emitting element of the pixels PX described with reference to FIG. 3. The light-emitting element may be electrically connected to the at least one transistor. In addition, the display element layer DP-OLED may further include at least one of an organic layer and an inorganic layer.

The thin film encapsulation layer TFE may be disposed on the circuit element layer DP-CL to encapsulate the display element layer DP-OLED. The thin film encapsulation layer TFE may include an inorganic layer, an organic layer, and an inorganic layer, which are sequentially stacked. The stack structure of the thin film encapsulation layer should not be particularly limited.

The base layer BL may have substantially the same shape as that of the display panel DP shown in FIG. 3 in a plane. The base layer BL may be disposed in the display area DP-DA and the non-display area DP-NDA.

The pixel driving circuit of the circuit element layer DP-CL may be disposed in the display area DP-DA. Some signal lines of the signal lines SL1~SLm, DL1~DLn, EL1~ELm, CSL1, CSL2, PL1, and PL2 of the circuit element layer DP-CL may be disposed in the display area DP-DA and the non-display area DP-NDA.

The light-emitting element of the display element layer DP-OLED may be disposed in the display area DP-DA. The thin film encapsulation layer TFE may be disposed in the display area DP-DA and the non-display area DP-NDA. However, the thin film encapsulation layer TFE may cover the display area DP-DA but may only cover a portion of the non-display area DP-NDA.

Figure 5:
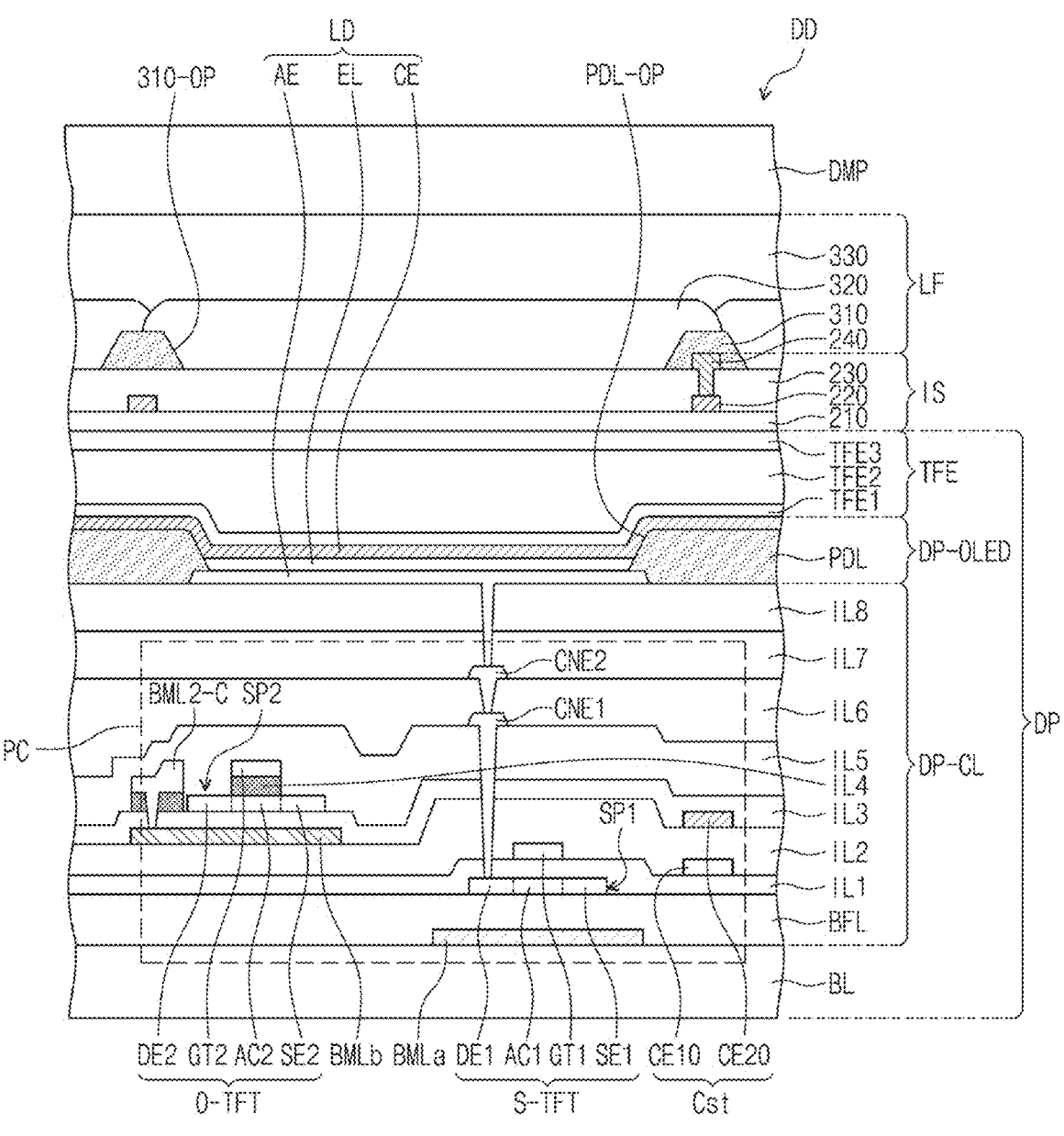
FIG. 5 is a cross-sectional view of an embodiment of some components of a display device according to the disclosure.

FIG. 5 is a cross-sectional view of an embodiment of some components of the display device DD according to the disclosure. FIG. 5 shows the display panel DP, an input sensor IS, an anti-reflective layer LF, and an impact absorbing layer DMP in one pixel of the display device DD.

FIG. 5 shows one light-emitting element LD and a silicon transistor S-TFT and an oxide transistor O-TFT of a pixel circuit PC. Among the transistors included in the pixel circuit PC, at least one transistor may be the oxide transistor O-TFT, and the other transistors may be the silicon transistor S-TFT.

A buffer layer BFL may be disposed on a base layer BL. The buffer layer BFL may prevent metal atoms or impurities from being diffused upward to a first semiconductor pattern SP1 from the base layer BL. The first semiconductor pattern SP1 may include an active area AC1 of the silicon transistor S-TFT. The buffer layer BFL may control a rate of heat supply during a crystallization process to form the first semiconductor pattern SP1 so that the first semiconductor pattern SP1 may be uniformly formed.

A first rear surface metal layer BMLa may be disposed under the silicon transistor S-TFT, and a second rear surface metal layer BMLb may be disposed under the oxide transistor O-TFT. The first and second rear surface metal layers BMLa and BMLb may overlap the pixel circuit PC. The first and second rear surface metal layers BMLa and BMLb may prevent an external light from reaching the pixel circuit PC.

The first rear surface metal layer BMLa may correspond to at least a portion of the pixel circuit PC. The first rear surface metal layer BMLa may overlap a driving transistor implemented by the silicon transistor S-TFT.

The first rear surface metal layer BMLa may be disposed between the base layer BL and the buffer layer BFL. In an embodiment, an inorganic barrier layer may be further disposed between the first rear surface metal layer BMLa and the buffer layer BFL. The first rear surface metal layer BMLa may be connected to an electrode or a wire and may receive a constant voltage or a signal from the electrode or wire. In an embodiment, the first rear surface metal layer BMLa may be a floating electrode that is isolated from other electrodes or wires.

The second rear surface metal layer BMLb may be disposed under the oxide transistor O-TFT. The second rear surface metal layer BMLb may be disposed between a second insulating layer IL2 and a third insulating layer IL3. The second rear surface metal layer BMLb may be disposed in the same layer as a second electrode CE20 of a storage capacitor Cst. The second rear surface metal layer BMLb may be connected to a contact electrode BML2-C to receive a constant voltage or a signal. The contact electrode BML2-C may be disposed in the same layer as a gate GT2 of the oxide transistor O-TFT.

Each of the first rear surface metal layer BMLa and the second rear surface metal layer BMLb may include a reflective metal. In an embodiment, each of the first rear surface metal layer BMLa and the second rear surface metal layer BMLb may include silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), p+ doped amorphous silicon, or the like. The first rear surface metal layer BMLa and the second rear surface metal layer BMLb may include the same material or may include different materials.

Although not shown separately, in an embodiment, the second rear surface metal layer BMLb may be omitted. The first rear surface metal layer BMLa may extend and may be disposed under the oxide transistor O-TFT, and the first rear surface metal layer BMLa may prevent the light incident to a lower portion of the oxide transistor O-TFT.

The first semiconductor pattern SP1 may be disposed on the buffer layer BFL. The first semiconductor pattern SP1 may include a silicon semiconductor. In an embodiment, the silicon semiconductor may include amorphous silicon or polycrystalline silicon. In an embodiment, the first semiconductor pattern SP1 may include low temperature polycrystalline silicon, for example.

FIG. 5 shows a portion of the first semiconductor pattern SP1 disposed on the buffer layer BFL, and the first semiconductor pattern SP1 may be further disposed in other areas. The first semiconductor pattern SP1 may be arranged with a predetermined rule over the pixels. The first semiconductor pattern SP1 may have different electrical properties depending on whether it is doped or not or whether it is doped with an N-type dopant or a P-type dopant. The first semiconductor pattern SP1 may include a first region having a relatively high conductivity and a second region having a relatively low conductivity. The first region may be doped with the N-type dopant or the P-type dopant. A P-type transistor may include a region doped with the P-type dopant, and an N-type transistor may include a region doped with the N-type dopant. The second region may be a non-doped region or a region doped at a concentration lower than that of the first region.

The first region may have a conductivity greater than that of the second region and may substantially serve as an electrode or a signal line. The second region may substantially correspond to an active area (or a channel) of the transistor. In other words, a portion of the first semiconductor pattern SP1 may be the active area of the transistor, another portion of the first semiconductor pattern SP1 may be a source or a drain of the transistor, and the other portion of the first semiconductor pattern SP1 may be a connection electrode or a connection signal line.

A source area SE1 (or a source), the active area AC1 (or a channel), and a drain area DE1 (or a drain) of the silicon transistor S-TFT may be formed from the first semiconductor pattern SP1. The source area SE1 and the drain area DE1 may extend in opposite directions to each other from the active area AC1 in a cross-section.

A first insulating layer IL1 may be disposed on the buffer layer BFL. The first insulating layer IL1 may commonly overlap the pixels and may cover the first semiconductor pattern SP1. The first insulating layer IL1 may be an inorganic layer and/or an organic layer and may have a single-layer or multi-layer structure. The first insulating layer IL1 may include at least one of aluminum oxide, titanium oxide, silicon oxide, silicon nitride, silicon oxynitride, zirconium oxide, and hafnium oxide. In the illustrated embodiment, the first insulating layer IL1 may have a single-layer structure of a silicon oxide layer. Not only the first insulating layer IL1, but also an insulating layer of the circuit element layer DP-CL described later may be an inorganic layer and/or an organic layer and may have a single-layer or multi-layer structure. The inorganic layer may include at least one of the above-mentioned materials, however, it should not be limited thereto or thereby.

A gate GT1 of the silicon transistor S-TFT may be disposed on the first insulating layer IL1. The gate GT1 may be a portion of a metal pattern. The gate GT1 may overlap the active area AC1. The gate GT1 may be used as a mask in a process of doping the first semiconductor pattern SP1. The gate GT1 may include titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide ("ITO"), indium zinc oxide ("IZO"), or the like, however, it should not be particularly limited.

The second insulating layer IL2 may be disposed on the first insulating layer IL1 and may cover the gate GT1. The third insulating layer IL3 may be disposed on the second insulating layer IL2. The second electrode CE20 of the storage capacitor Cst may be disposed between the second insulating layer IL2 and the third insulating layer IL3. In addition, a first electrode CE10 of the storage capacitor Cst may be disposed between the first insulating layer IL1 and the second insulating layer IL2.

A second semiconductor pattern SP2 may be disposed on the third insulating layer IL3. The second semiconductor pattern SP2 may include an active area AC2 of the oxide transistor O-TFT described later. The second semiconductor pattern SP2 may include an oxide semiconductor. The second semiconductor pattern SP2 may include a transparent conductive oxide ("TCO"), such as ITO, IZO, indium gallium zinc oxide ("IGZO"), zinc oxide (ZnO), or indium oxide ($In_2O_3$).

The oxide semiconductor may include a plurality of areas distinguished from each other depending on whether a metal oxide is reduced. The area (hereinafter, also referred to as a "reduced area") in which the metal oxide is reduced has a conductivity greater than that of the area (hereinafter, also referred to as a "non-reduced area") in which the metal oxide is not reduced. The reduced area may substantially act as the source/drain of the transistor or the signal line. The non-reduced area may substantially correspond to the semiconductor area (or the active area or the channel) of the transistor. In other words, a portion of the second semiconductor pattern SP2 may be the semiconductor area of the transistor, another portion of the second semiconductor pattern SP2 may be the source area/drain area of the transistor, and the other portion of the second semiconductor pattern SP2 may be a signal transmission area.

A source area SE2 (or a source), the active area AC2 (or a channel), and a drain area DE2 (or a drain) of the oxide transistor O-TFT may be formed from the second semiconductor pattern SP2. The source area SE2 and the drain area DE2 may extend in opposite directions to each other from the active area AC2 in a cross-section.

A fourth insulating layer IL4 may be disposed on the third insulating layer IL3. As shown in FIG. 5, the fourth insulating layer IL4 may be an insulating pattern that overlaps the gate GT2 of the oxide transistor O-TFT and exposes the source area SE2 and the drain area DE2 of the oxide transistor O-TFT. As shown in FIG. 5, the fourth insulating layer IL4 may cover the second semiconductor pattern SP2.

As shown in FIG. 5, the gate GT2 of the oxide transistor O-TFT may be disposed on the fourth insulating layer IL4. The gate GT2 of the oxide transistor O-TFT may be a portion of a metal pattern. The gate GT2 of the oxide transistor O-TFT may overlap the active area AC2.

A fifth insulating layer IL5 may be disposed on the fourth insulating layer IL4 and may cover the gate GT2. A first connection electrode CNE1 may be disposed on the fifth insulating layer IL5. The first connection electrode CNE1 may be connected to the drain area DE1 of the silicon transistor S-TFT via a contact hole defined through the first, second, third, fourth, and fifth insulating layers IL1, IL2, IL3, IL4, and IL5.

A sixth insulating layer IL6 may be disposed on the fifth insulating layer IL5. A second connection electrode CNE2 may be disposed on the sixth insulating layer IL6. The second connection electrode CNE2 may be connected to the first connection electrode CNE1 via a contact hole defined through the sixth insulating layer IL6. A seventh insulating layer IL7 may be disposed on the sixth insulating layer IL6 and may cover the second connection electrode CNE2. An eighth insulating layer IL8 may be disposed on the seventh insulating layer IL7.

Each of the sixth insulating layer IL6, the seventh insulating layer IL7, and the eighth insulating layer IL8 may be an organic layer. In an embodiment, each of the sixth insulating layer IL6, the seventh insulating layer IL7, and the eighth insulating layer IL8 may include a general-purpose polymer such as benzocyclobutene ("BCB"), polyimide, hexamethyldisiloxane ("HMDSO"), polymethylmethacrylate ("PMMA"), or polystyrene ("PS"), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The light-emitting element LD may include a first electrode AE, a light-emitting layer EL, and a second electrode CE. The second electrode CE may be commonly provided on a plurality of light-emitting elements.

The first electrode AE of the light-emitting element LD may be disposed on the eighth insulating layer IL8. The first electrode AE of the light-emitting element LD may be a semi-transmissive electrode, a transmissive electrode, or a reflective electrode. In an embodiment, the first electrode AE of the light-emitting element LD may include a reflective layer including Ag, Mg, Al, Pt, Pd, Au, Ni, Nd, Ir, Cr, or any combinations thereof and a transparent or semi-transparent electrode layer formed on the reflective layer. The transparent or semi-transparent electrode layer may include at least one of ITO, IZO, IGZO, zinc oxide (ZnO), indium oxide ($In_2O_3$), and aluminum-doped zinc oxide ("AZO"). For instance, the first electrode AE of the light-emitting element LD may include a stack structure of ITO/Ag/ITO.

A pixel definition layer PDL may be disposed on the eighth insulating layer IL8. The pixel definition layer PDL may have a light absorbing property. In an embodiment, the pixel definition layer PDL may have a black color, for example. The pixel definition layer PDL may include a black coloring agent. The black coloring agent may include a black dye or a black pigment. The black coloring agent may include a metal material, such as carbon black, chromium, or an oxide thereof. The pixel definition layer PDL may correspond to a light-blocking pattern having a light-blocking property.

The pixel definition layer PDL may cover a portion of the first electrode AE of the light-emitting element LD. In an embodiment, an opening PDL-OP may be defined through the pixel definition layer PDL to expose a portion of the first electrode AE of the light-emitting element LD. The pixel definition layer PDL may increase a distance between an edge of the first electrode AE and the second electrode CE of the light-emitting element LD. Accordingly, an occurrence of an arc on the edge of the first electrode AE may be prevented by the pixel definition layer PDL.

Although not shown in drawing figures, a hole control layer may be disposed between the first electrode AE and the light-emitting layer EL. The hole control layer may include a hole transport layer and may further include a hole injection layer. An electron control layer may be disposed between the light-emitting layer EL and the second electrode CE. The electron control layer may include an electron transport layer and may further include an electron injection layer. The hole control layer and the electron control layer may be commonly formed over the plural pixels PX using an open mask.

The thin film encapsulation layer TFE may be disposed on the light-emitting element layer DP-OLED. The thin film encapsulation layer TFE may include an inorganic layer TFE1, an organic layer TFE2, and an inorganic layer TFE3, which are sequentially stacked, however, layers included in the thin film encapsulation layer TFE should not be limited thereto or thereby.

The inorganic layers TFE1 and TFE3 may protect the light-emitting element layer DP-OLED from moisture and oxygen, and the organic layer TFE2 may protect the light-emitting element layer DP-OLED from a foreign substance such as dust particles. The inorganic layers TFE1 and TFE3 may include a silicon nitride layer, a silicon oxynitride layer, a silicon oxide layer, a titanium oxide layer, or an aluminum oxide layer. The organic layer TFE2 may include an acrylic-based organic layer, however, it should not be limited thereto or thereby.

The input sensor IS may be disposed on the display panel DP. The input sensor IS may be also referred to as a sensor, an input sensing layer, or an input sensing panel. The input sensor IS may include a sensor base layer 210, a first conductive layer 220, a sensing insulating layer 230, and a second conductive layer 240.

The sensor base layer 210 may be disposed directly on the display panel DP. The sensor base layer 210 may be an inorganic layer including at least one of silicon nitride, silicon oxynitride, and silicon oxide. In an embodiment, the sensor base layer 210 may be an organic layer including an epoxy resin, an acrylic resin, or an imide-based resin. The sensor base layer 210 may have a single-layer structure or a multi-layer structure of layers stacked in the third direction DR3.

Each of the first conductive layer 220 and the second conductive layer 240 may have a single-layer structure or a multi-layer structure of layers stacked in the third direction DR3. The first conductive layer 220 and the second conductive layer 240 may include conductive lines to define sensing electrodes having a mesh shape. The conductive lines may not overlap the opening PDL-OP and may overlap the pixel definition layer PDL.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as ITO, IZO, zinc oxide (ZnO), indium zinc tin oxide ("IZTO"), or the like. In addition, the transparent conductive layer may include conductive polymer such as poly(3,4-ethylenedioxythiophene) ("PEDOT"), metal nanowire, graphene, or the like.

The conductive layer having the multi-layer structure may include metal layers sequentially stacked. The metal layers may have a three-layer structure of titanium/aluminum/titanium. The conductive layer having the multi-layer structure may include at least one metal layer and at least one transparent conductive layer.

The sensing insulating layer 230 may be disposed between the first conductive layer 220 and the second conductive layer 240. The sensing insulating layer 230 may include an inorganic layer. The inorganic layer may include at least one of aluminum oxide, titanium oxide, silicon oxide, silicon nitride, silicon oxynitride, zirconium oxide, and hafnium oxide.

In an embodiment, the sensing insulating layer 230 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The anti-reflective layer LF may be disposed on the input sensor IS. The anti-reflective layer LF may include a division layer 310, a plurality of color filters 320, and a planarization layer 330.

Materials for the division layer 310 should not be particularly limited as long as the materials absorb a light. The division layer 310 may have a black color and may include a black coloring agent. The black coloring agent may include a black dye or a black pigment. The black coloring agent may include a metal material, such as carbon black, chromium, or an oxide thereof.

The division layer 310 may cover the second conductive layer 240 of the input sensor IS. The division layer 310 may prevent the external light from being reflected by the second conductive layer 240. The division layer 310 may be omitted in some areas of a display device DD. The area where the division layer 310 is not disposed may have a transmittance higher than that of the other area where the division layer 310 is disposed.

An opening 310-OP may be defined through the division layer 310. The opening 310-OP may overlap the first electrode AE of the light-emitting element LD. One of the color filters 320 may overlap the first electrode AE of the light-emitting element LD. One of the color filters 320 may cover the opening 310-OP. Each of the color filters may contact the division layer 310.

The planarization layer 330 may cover the division layer 310 and the color filters 320. The planarization layer 330 may include an organic material and may provide a flat surface thereon. In an embodiment, the planarization layer 330 may be omitted.

The impact absorbing layer DMP may be disposed on the display panel DP. In detail, the impact absorbing layer DMP may be disposed on the anti-reflective layer LF. The impact absorbing layer DMP may have a multi-layer structure or a single-layer structure, and the impact absorbing layer DMP may have the single-layer structure in the illustrated embodiment.

The impact absorbing layer DMP may include polymer. In an embodiment, the impact absorbing layer DMP may include polyimide, polycarbonate, polyamide, triacetylcellulose, polymethylmethacrylate, or polyethylene terephthalate.

The impact absorbing layer DMP may absorb the external impact applied to the front surface of the display device DD. In detail, the impact absorbing layer DMP may prevent the display panel DP from being deformed. In an embodiment, the impact absorbing layer DMP may increase a resistance to the external impact caused by pressure such as nails or pens. Accordingly, defects such as bright spots may be prevented from occurring on the display panel DP.

Figure 6A:
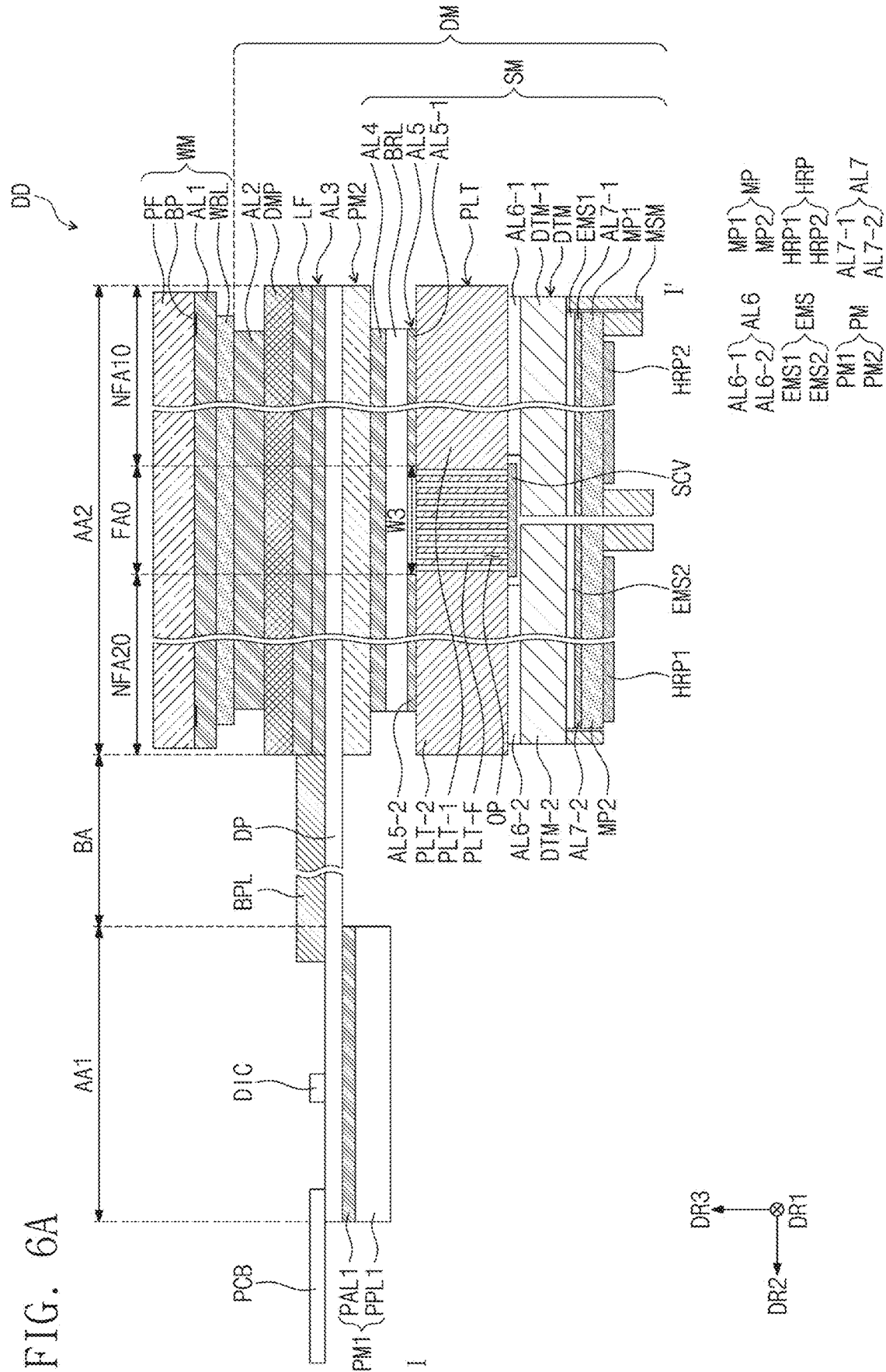
FIG. 6A is a cross-sectional view of an embodiment of a display device in a non-bent state according to the disclosure.
Figure 6B:
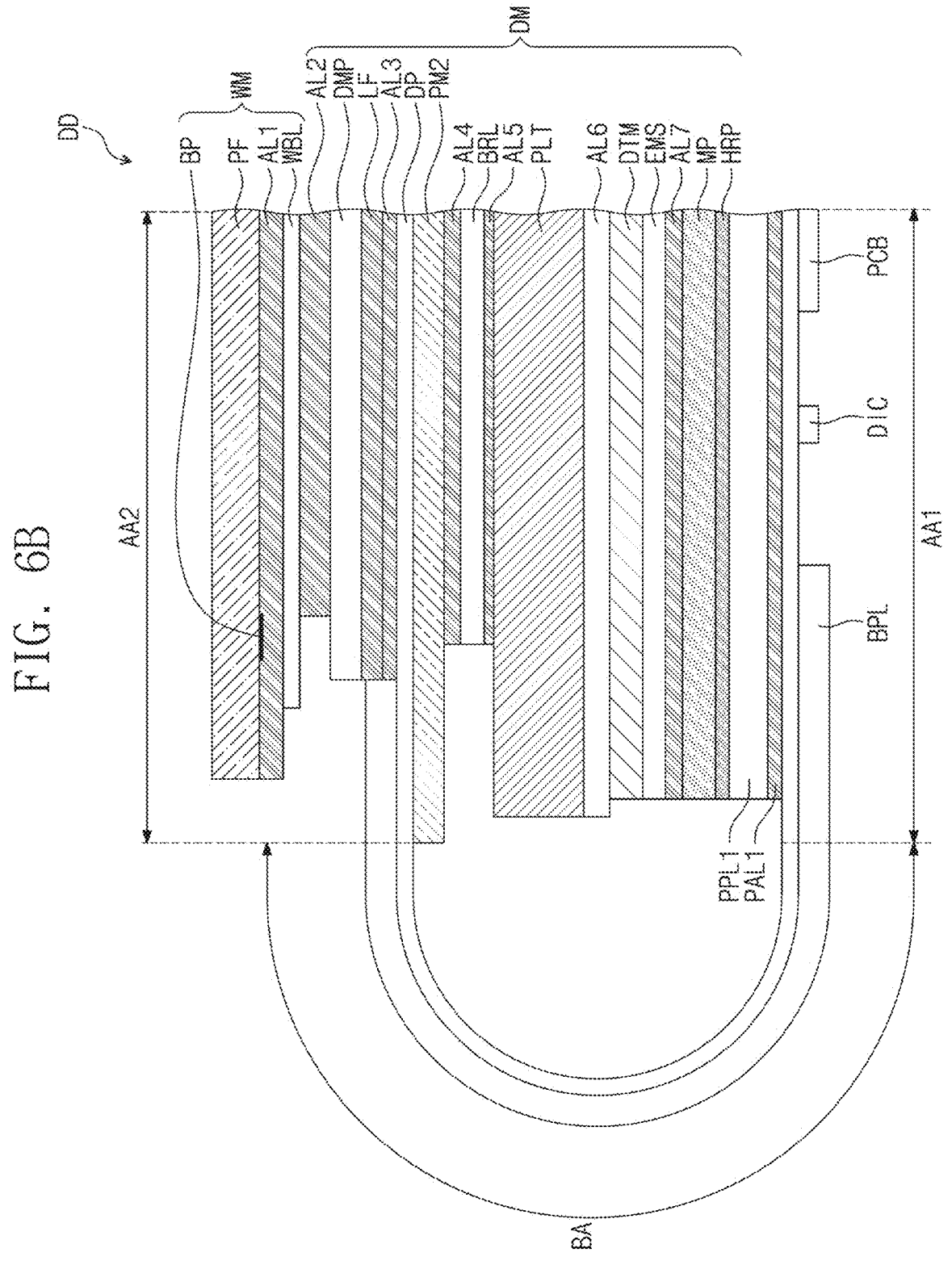
FIG. 6B is a cross-sectional view of an embodiment of a display device in a bent state according to the disclosure.

FIG. 6A is a cross-sectional view of an embodiment of the display device DD in a non-bent state according to the disclosure. FIG. 6B is a cross-sectional view of an embodiment of the display device DD in a bent state according to the disclosure. FIG. 6A is a cross-sectional view taken along line I-I' of FIG. 3. FIG. 6B is a cross-sectional view of a portion of the display device DD when the bending area BA is in the bent state. FIG. 6A shows the display device DD before the display panel DP is bent, and when assuming that the display panel DP is installed in the display device DD, the first area AA1 and the second area AA2 of the display panel DP may be disposed in different planes from each other in the unfolded state of the display device DD shown in FIG. 1A. This is as shown in FIG. 6B. The shape of the bending area BA will be described later with reference to FIG. 6B.

Referring to FIGS. 6A and 6B, the display device DD may include a window module WM and the display module DM.

The window module WM may include a window base layer WBL, a window protective layer PF disposed on the window base layer WBL, and a bezel pattern BP disposed under the window protective layer PF. In the illustrated embodiment, the window protective layer PF may include a plastic film. The window module WM may further include an adhesive layer AL1 (hereinafter, also referred to as a first adhesive layer) that attaches the window protective layer PF to the window base layer WBL.

The bezel pattern BP may overlap the non-display area DP-NDA (refer to FIG. 3). The bezel pattern BP may be disposed on one surface of the window base layer WBL or one surface of the window protective layer PF. FIG. 6A shows the structure in which the bezel pattern BP is disposed on a lower surface of the window protective layer PF, however, it should not be limited thereto or thereby. In an embodiment, the bezel pattern BP may be disposed on an upper surface of the window protective layer PF. The bezel pattern BP may be a colored light-blocking layer and may be formed by a coating process. The bezel pattern BP may include a base material and a pigment or a dye mixed with the base material. The bezel pattern BP may have a closed loop shape when viewed in the plane.

In a plan view, an edge of the window base layer WBL may not overlap the bezel pattern BP. When the above conditions are satisfied, the edge of the window base layer WBL may be exposed without being covered by the bezel pattern BP, and fine cracks generated on the edge of the window base layer WBL may be inspected using an inspection device. In an embodiment, cracks originated from the edge of the window base layer WBL may be identified by photographing the edge of the window base layer WBL at an upper side of the window protective layer PF with an inspection device such as a microscope. However, in an embodiment, the bezel pattern BP may overlap the edge of the window base layer WBL.

The window base layer WBL may include a glass substrate or a plastic substrate. In an embodiment, the window base layer WBL may be the plastic substrate including polyimide, polycarbonate, or polyethylene terephthalate. In an embodiment, the window base layer WBL may be a chemically strengthened glass. When the window base layer WBL is the chemically strengthened glass, the window base layer WBL may have a thickness in a range from about 15 micrometers (μm) to about 45 μm in the third direction DR3. The occurrence of crease in window base layer WBL may be minimized even though the folding and unfolding operations are repeatedly performed.

The window protective layer PF may have a thickness in a range from about 50 μm to about 80 μm. The window protective layer PF may include polyimide, polycarbonate, polyamide, triacetylcellulose, polymethylmethacrylate, or polyethylene terephthalate. Although not shown in drawing figures, at least one of a hard coating layer, an anti-finger-print layer, and an anti-reflective layer may be disposed on the upper surface of the window protective layer PF.

The first adhesive layer AL1 may be a pressure sensitive adhesive ("PSA") film or an OCA. Adhesive layers described hereinafter may include the same adhesive as the first adhesive layer AL1 and may include a conventional adhesive.

The first adhesive layer AL1 may be separated from the window base layer WBL. Since a strength of the window protective layer PF is lower than that of the window base layer WBL, scratches may occur relatively easily on the window protective layer PF. After the first adhesive layer AL1 and the window protective layer PF are separated from each other, another window protective layer PF may be attached to the window base layer WBL.

Although not shown in drawing figures, the window protective layer PF may include a plastic resin layer disposed directly on an upper surface of the window base layer WBL. The plastic resin layer that contacts the upper surface of the window base layer WBL may be formed using an insert molding method. The bezel pattern BP may be formed on the window base layer WBL before the plastic resin layer is formed. Accordingly, the plastic resin layer may cover the bezel pattern BP.

Although not shown in drawing figures, the hard coating layer may be disposed on the window protective layer PF. The hard coating layer may be disposed at an outermost surface of the window protective layer PF as a functional layer that improves characteristics of use of the display device DD. In an embodiment, the hard coating layer may improve anti-fingerprint characteristics, anti-pollution characteristics, scratch-resistant characteristics, or the like, for example.

The display module DM may include the impact absorbing layer DMP, the anti-reflective layer LF, the display panel DP, a panel protective member PM, and a support member SM. The support member SM may include a barrier layer BRL, a support layer PLT, a cover layer SCV, a digitizer DTM, an electromagnetic shielding layer EMS, a lower metal plate MP, a heat dissipation layer HRP, and a magnetic shielding sheet MSM. The display module DM may include second, third, fourth, fifth, sixth, and seventh adhesive layers AL2, AL3, AL4, AL5, AL6, and AL7. The second to seventh adhesive layers AL2 to AL7 may include an adhesive such as a PSA or an OCA. In an embodiment, some of the above-mentioned components may be omitted. For instance, the lower metal plate MP and the seventh adhesive layer AL7 may be omitted. In an embodiment, the heat dissipation layer HRP and the magnetic shielding sheet MSM may be omitted. As shown in FIGS. 6A and 6B, the input sensor IS is not shown between the display panel DP and the anti-reflective layer LF, however, in an embodiment, the input sensor IS may be disposed between the display panel DP and the anti-reflective layer LF as shown in FIG. 5.

The impact absorbing layer DMP may be disposed on the display panel DP and may protect the display panel DP from the external impact. The display panel DP may have an impact resistance improved by the impact absorbing layer DMP. The impact absorbing layer DMP may be coupled to the window module WM by the second adhesive layer AL2. Although not shown in drawing figures, an adhesive layer may be disposed between the impact absorbing layer DMP and the anti-reflective layer LF, and thus, the impact absorbing layer DMP may be coupled to the anti-reflective layer LF by the adhesive layer. The anti-reflective layer LF may be coupled to the display panel DP by the third adhesive layer AL3.

The panel protective member PM may be disposed under the display panel DP. The panel protective member PM may protect a lower portion of the display panel DP. In an embodiment, the panel protective member PM may not overlap the bending area BA. That is, the panel protective member PM may not be disposed under the display panel DP in the bending area BA. The panel protective member PM may include a first protective member PM1 corresponding to the first area AA1 of the display panel DP and a second protective member PM2 corresponding to the second area AA2.

The first protective member PM1 may include a first protective layer PPL1. The first protective layer PPL1 may include a flexible plastic material. In an embodiment, the first protective layer PPL1 may include polyethylene terephthalate. The first protective member PM1 may include a first coupling layer PAL1 and the first protective layer PPL1. The first protective layer PPL1 may be coupled to the display panel DP by the first coupling layer PAL1. The first coupling layer PAL1 may be a PSA film and may include a conventional PSA.

The second protective member PM2 may include a second protective layer. The second protective layer may include a plastic material that is advantageous for the bending operation.

As shown in FIG. 6B, when the bending area BA is bent, the first protective member PM1 corresponding to the first area AA1 may be disposed under the second protective member PM2 corresponding to the second area AA2. As the bending area BA of the display panel DP is bent, the first area AA1 and the second area AA2 may be disposed in different planes from each other. The driving circuit DIC disposed in the first area AA1 may be disposed under the second area AA2. Since the panel protective member PM is not disposed in the bending area BA, the bending area BA may be more easily bent.

The bending area BA may have a predetermined curvature and a predetermined radius of curvature. The radius of curvature may be within a range from about 0.1 millimeter (mm) to about 0.5 mm.

As shown in FIGS. 6A and 6B, the fourth adhesive layer AL4 may attach the second protective member PM2 to the barrier layer BRL. The barrier layer BRL may be disposed under the second protective member PM2. The barrier layer BRL may increase a resistance against a compressive force caused by external pressure. Accordingly, the barrier layer BRL may prevent the display panel DP from being deformed. The barrier layer BRL may include a flexible plastic material, such as polyimide or polyethylene terephthalate. In addition, the barrier layer BRL may be a colored film with low light transmittance. The barrier layer BRL may absorb a light incident thereto from the outside. In an embodiment, the barrier layer BRL may be a black plastic film. When looking at the display device DD from an upper side of the window protective layer WP, components disposed under the barrier layer BRL may not be viewed by the user.

The fifth adhesive layer AL5 may attach the barrier layer BRL to the support layer PLT. The fifth adhesive layer AL5 may include a first adhesive portion AL5-1 and a second adhesive portion AL5-2 separated from the first adhesive portion AL5-1. A separation distance W3 between the first adhesive portion AL5-1 and the second adhesive portion AL5-2 may correspond to a width of the folding area FAO and may be greater than a gap between first and second digitizers DTM-1 and DTM-2 of the digitizer DTM described later. The separation distance W3 between the first adhesive portion AL5-1 and the second adhesive portion AL5-2 may be within a range from about 7 mm to about 15 mm, preferably, about 9 mm to about 12 mm. In an embodiment, the separation distance W3 between the first adhesive portion AL5-1 and the second adhesive portion AL5-2 may be about 9.65 mm.

In the illustrated embodiment, the first adhesive portion AL5-1 and the second adhesive portion AL5-2 may be defined as different portions of one adhesive layer, however, they should not be limited thereto or thereby. When the first adhesive portion AL5-1 is defined as one adhesive layer, e.g., a first adhesive layer, the second adhesive portion AL5-2 may be defined as another adhesive layer, e.g., a second adhesive layer.

The support layer PLT may be disposed under the barrier layer BRL. The support layer PLT may support components disposed on the support layer and may maintain the unfolded state and the folded state of the display device DD. The support layer PLT may include a first support portion PLT-1 corresponding to the first non-folding area NFA10 and a second support portion PLT-2 corresponding to the second non-folding area NFA20. The first support portion PLT-1 and the second support portion PLT-2 may be spaced apart from each other in the second direction DR2.

The support layer PLT may further include a folding portion PLT-F corresponding to the folding area FAO, disposed between the first support portion PLT-1 and the second support portion PLT-2, and provided with a plurality of openings OP defined therethrough. Since the openings OP are defined through the folding portion PLT-F, a stress applied to the support layer PLT during the folding operation shown in FIGS. 1B and 2B may be reduced. The openings OP defined through the folding portion PLT-F may be defined along a plurality of rows arranged to be staggered with each other.

The support layer PLT may be selected from materials that transmit an electromagnetic field generated by the digitizer DTM described below without loss or with minimal loss. The support layer PLT may include a non-metallic material. The support layer PLT may include a plastic, glass fiber reinforced plastic, or glass. The support layer PLT may include be a carbon fiber reinforced plastic ("CFRP"). The first support portion PLT-1, the second support portion PLT-2, and the folding portion PLT-F, which are included in the support layer PLT, may include the same material as each other. The first support portion PLT-1, the second support portion PLT-2, and the folding portion PLT-F may be provided integrally with each other, however, they should not be limited thereto or thereby. In an embodiment, the support layer PLT may include a metal material. In an embodiment, the digitizer DTM may be omitted from the display device DD, and the support layer PLT may include a metal material.

The openings OP may be defined through a portion of the support layer PLT corresponding to the folding area FAO. The openings OP may be defined through the folding portion PLT-F of the support layer PLT. Due to the openings OP, a flexibility of the support layer PLT may be improved. As the fifth adhesive layer AL5 is not disposed in an area corresponding to the folding area FAO, the flexibility of the support layer PLT may be improved.

The sixth adhesive layer AL6 and the cover layer SCV may be disposed under the support layer PLT. Hereinafter, the sixth adhesive layer AL6 may be also referred to as a lower adhesive layer.

The cover layer SCV may be formed in the form of a sheet and may be attached to the support layer PLT. The cover layer SCV may have an elastic modulus smaller than that of the support layer PLT. In an embodiment, the cover layer SCV may include at least one of thermoplastic polyurethane, rubber, or silicone. Although not shown in drawing figures, the cover layer SCV may be attached to a lower portion of the support layer PLT by a separate adhesive layer.

The lower adhesive layer AL6 may be disposed under the support layer PLT, and the support layer PLT may be attached to the digitizer DTM by the lower adhesive layer AL6. The lower adhesive layer AL6 may include a first lower adhesive layer AL6-1 disposed under the first support portion PLT-1 and a second lower adhesive layer AL6-2 disposed under the second support portion PLT-2.

The digitizer DTM may be referred to as an EMR sensing panel and may include a plurality of loop coils generating a magnetic field with the electronic pen at a predetermined resonant frequency. The magnetic field generated by the loop coils may be applied to an LC resonant circuit formed by an inductor (coil) and a capacitor of the electronic pen. The coil may generate a current in response to the magnetic field applied thereto and may supply the generated current to the capacitor. Accordingly, the capacitor may be charged with the current supplied thereto from the coil and may discharge the charged current to the coil. Consequently, the magnetic field of the resonant frequency may be emitted from the coil. The magnetic field emitted by the electronic pen may be absorbed by the loop coils of the digitizer, and thus, it is possible to determine a position in a touch screen to which the electronic pen gets close.

The digitizer DTM may include the first digitizer DTM-1 attached to a lower portion of the first lower adhesive layer AL6-1 and the second digitizer DTM-2 attached to the second lower adhesive layer AL6-2. The first digitizer DTM-1 and the second digitizer DTM-2 may be disposed spaced apart from each other by a predetermined gap. The gap may be equal to or greater than about 0.3 mm and equal to or smaller than about 3 mm. In detail, the gap may be equal to or greater than about 0.4 mm and equal to or smaller than about 2 mm. The gap may be defined to correspond to the folding area FAO. In an embodiment, the digitizer DTM may be omitted.

The electromagnetic shielding layer EMS may be disposed under the digitizer DTM. Although not shown in drawing figures, the display device DD may include an electronic module, such as a camera module, a sensor module, or the like, and a control module controlling the electronic module, and the electromagnetic shielding layer EMS may prevent electromagnetic waves generated by the electronic module and the control module disposed under the support member SM from exerting an influence on the digitizer DTM as noise. The electromagnetic shielding layer EMS may include a first electromagnetic shielding layer EMS-1 corresponding to the first digitizer DTM-1 and a second electromagnetic shielding layer EMS-2 corresponding to the second digitizer DTM-2. In the illustrated embodiment, the electromagnetic shielding layer EMS may be a copper sheet. The electromagnetic shielding layer EMS may include a magnetic metal powder ("MMP"). The magnetic metal powder may be directly formed on a lower surface of the digitizer DTM by coating and curing processes. In an embodiment, the electromagnetic shielding layer EMS may be omitted.

The electromagnetic shielding layer EMS may be coupled to the lower metal plate MP by the seventh adhesive layer AL7. The seventh adhesive layer AL7 may include a first portion AL7-1 and a second portion AL7-2 spaced apart from the first portion AL7-1. The lower metal plate MP may include a first lower metal plate MP1 attached to the first portion AL7-1 and a second lower metal plate MP2 attached to the second portion AL7-2. The lower metal plate MP may improve a heat dissipation property and may protect components disposed above the lower metal plate MP from an external pressure generated in the attachment process of bending and fixing the first protective member PM1 as shown in FIG. 6B. The lower metal plate MP may include a material with an elastic modulus equal to or greater than about 60 gigapascals (GPa) and may include a metal material such as stainless steel. In an embodiment, the lower metal plate MP may include a stainless steel, e.g., SUS 304.

The heat dissipation layer HRP may be disposed under the lower metal plate MP. The heat dissipation layer HRP may be a sheet with a high thermal conductivity. The heat dissipation layer HRP may include a metal or metal alloy. In an embodiment, the heat dissipation layer HRP may include copper, copper alloy, or graphite.

The heat dissipation layer HRP may include a first heat dissipation layer HRP1 and a second heat dissipation layer HRP2. The first heat dissipation layer HRP1 and the second heat dissipation layer HRP2 may be spaced apart from each other by a predetermined distance. The distance between the first heat dissipation layer HRP1 and the second heat dissipation layer HRP2 may be within a range from about 0.4 mm to about 2 mm, however, it should not be particularly limited. The distance between the first heat dissipation layer HRP1 and the second heat dissipation layer HRP2 may be defined to correspond to the folding area FAO.

The magnetic shielding sheet MSM may be disposed under the digitizer DTM. The magnetic shielding sheet MSM may include a plurality of portions. Among the portions, at least two portions may have different thicknesses from each other. The portions of the magnetic shielding sheet MSM may match a step difference of a bracket (not shown) disposed under the display device DD. The magnetic shielding sheet MSM may be disposed under a portion of the digitizer DTM where the electromagnetic shielding layer EMS is not disposed. In addition, the magnetic shielding sheet MSM may be disposed under a portion of the lower metal plate MP where the heat dissipation layer HRP is not disposed. The magnetic shielding sheet MSM may have a structure in which a magnetic shielding layer and an adhesive layer are alternately stacked one on another. The magnetic shielding sheet MSM may shield a magnetic field generated by a magnetic substance (not shown) disposed thereunder. The magnetic shielding sheet MSM may prevent the magnetic field generated by the magnetic substance from interfering with the digitizer DTM. Although not shown in drawing figures, the printed circuit board PCB may be disposed on the magnetic shielding sheet MSM.

The display device DD may include a bending protective layer BPL. The bending protective layer BPL may be disposed in the bending area BA. The bending protective layer BPL may extend to the first area AA1 and may be disposed in the first area AA1 adjacent to the bending area BA. The bending protective layer BPL may be spaced apart from the driving circuit DIC. The bending protective layer BPL may include an acrylic-based resin or a urethane-based resin.

The bending protective layer BPL may protect the bending area BA. The bending protective layer BPL may cover and protect wirings disposed in the bending area BA. The bending protective layer BPL may supplement a rigidity of the bending area BA, and thus, the bending protective layer BPL may prevent cracks from occurring in the bending area BA when the bending area BA is bent. The bending protective layer BPL may protect the bending area BA from external impacts.

Although not shown in drawing figures, the display device DD may further include a spacer that overlaps the driving circuit DIC when the display panel DP is in the bent state. The spacer may disperse heat generated from the driving circuit DIC during the operation of the display device DD and may prevent deterioration of the display device DD.

Figure 7A:
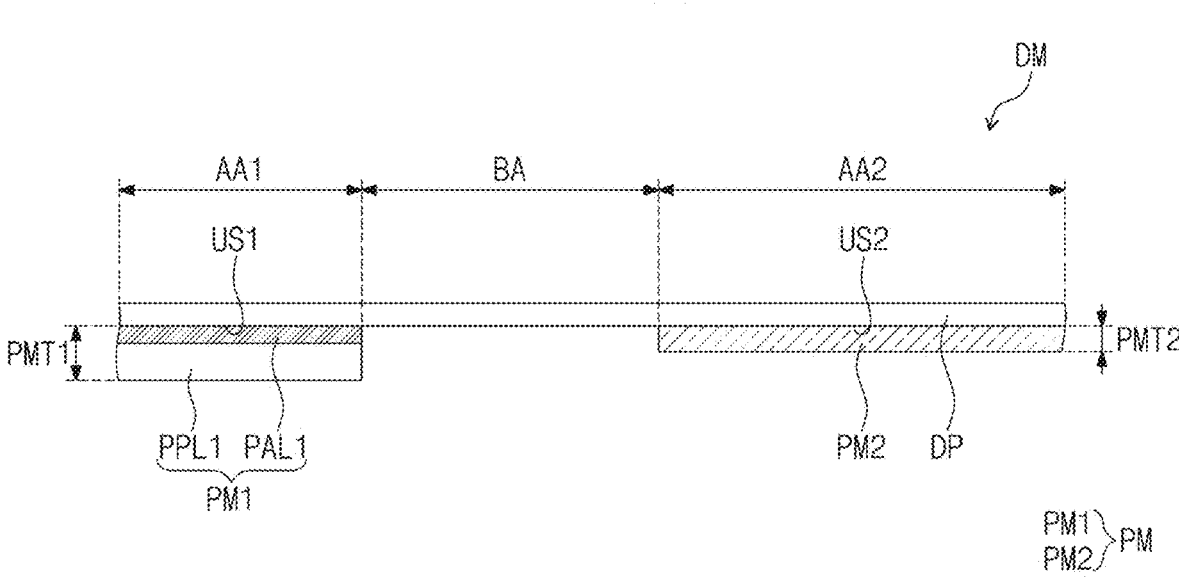
FIG. 7A to 7D are enlarged cross-sectional views of an embodiment of display modules according to the disclosure.
Figure 7B:
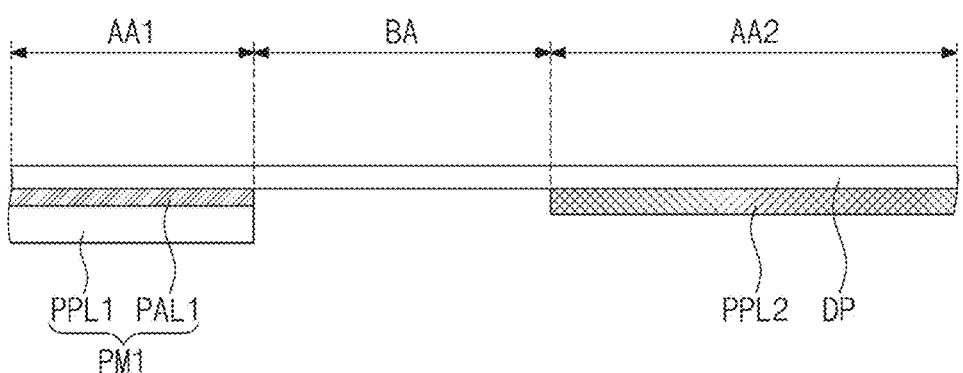
Figure 7C:
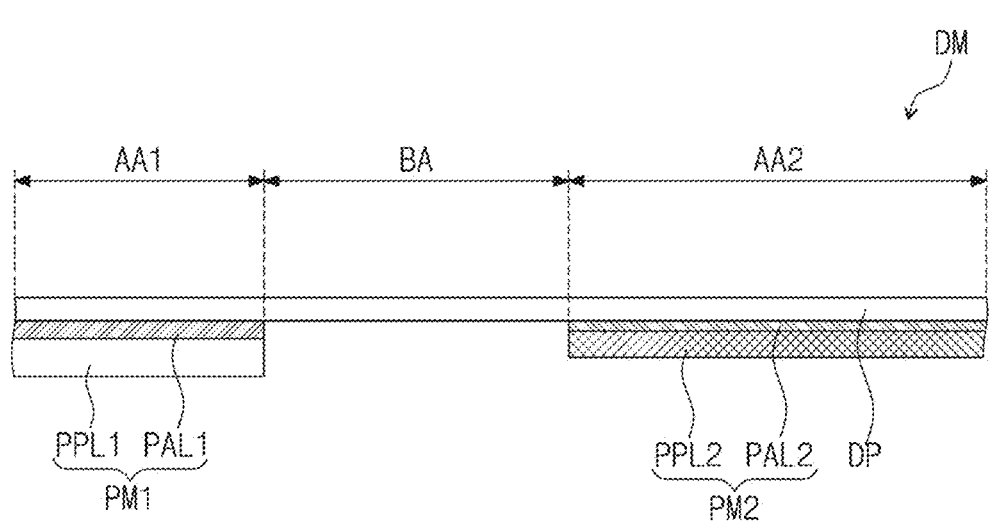
Figure 7D:
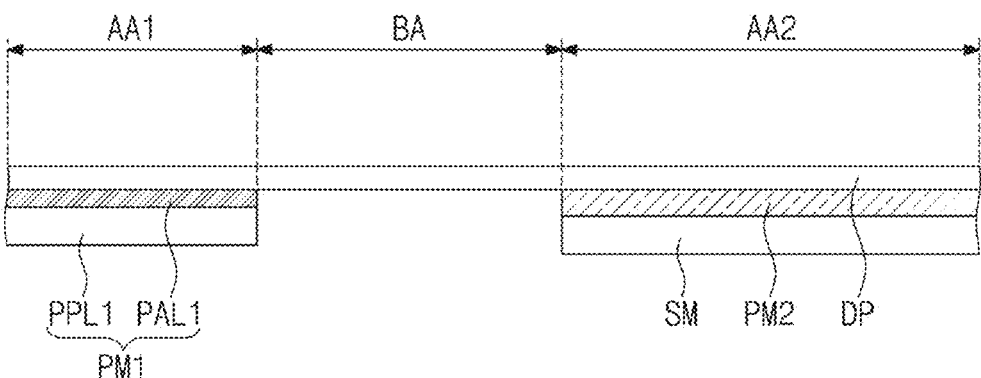

FIGS. 7A to 7D are enlarged cross-sectional views of an embodiment of display modules according to the disclosure. FIG. 7A is an enlarged cross-sectional view showing the display panel DP and the panel protective member PM included in the display module DM shown in FIG. 6A. FIGS. 7B to 7D are enlarged cross-sectional views showing an embodiment of components included in a display module different from the display module DM shown in FIG. 7A.

Referring to FIGS. 7A to 7D, the panel protective member PM may include the first protective member PM1 disposed under the first area AA1 of the display panel DP and a second protective member PM2 disposed under the second area AA2 of the display panel DP. The panel protective member PM may include the first protective member PM1 disposed on a first lower surface US1 of the display panel DP and the second protective member PM2 disposed on a second lower surface US2 of the display panel DP. The first lower surface US1 may indicate a surface of the lower surface of the display panel DP, which overlaps the first area AA1. The second lower surface US2 may indicate a surface of the lower surface of the display panel DP, which overlaps the second area AA2.

The first protective member PM1 may include the first coupling layer PAL1 and the first protective layer PPL1. As shown in FIG. 7B, the second protective member PM2 may include only a second protective layer PPL2. The second protective layer PPL2 may be disposed under the display panel DP without using an additional adhesive layer in the second area AA2. That is, the second protective layer PPL2 may be disposed directly on the second lower surface US2.

As shown in FIG. 7C, the second protective member PM2 may include the second protective layer PPL2 and a second coupling layer PAL2. The second protective layer PPL2 may be attached to a lower portion of the display panel DP by the second coupling layer PAL2 in the second area AA2. The second coupling layer PAL2 may be disposed between the second protective layer PPL2 and the display panel DP. An upper surface of the second coupling layer PAL2 may contact the second lower surface US2, and a lower surface of the second coupling layer PAL2 may contact an upper surface of the second protective layer PPL2.

Referring to FIG. 7D, a support member SM may be disposed under the second protective member PM2. As described with reference to FIGS. 6A and 6B, the support member SM may include the barrier layer, the support layer, the cover layer, the digitizer, the electromagnetic shielding layer, the lower metal plate, the heat dissipation layer, and the magnetic shielding sheet. For easy bending, the protective layer or the protective member may not be disposed under the bending area BA of the display panel DP.

Referring to FIG. 7A, in the display device DD, the first protective member PM1 may have a first thickness PMT1 different from a second thickness PMT2 of the second protective member PM2. The first thickness PMT1 of the first protective member PM1 may be greater than the second thickness PMT2 of the second protective member PM2. As the second protective member PM2 having a thickness less than that of the first protective member PM1 is disposed on the second lower surface US2, the display panel DP in the second area AA2 may be advantageous for the bending and folding operations.

As shown in FIGS. 7A and 7B, in the case where the second protective member PM2 includes only the second protective layer PPL2, the first thickness PMT1 of the first protective member PM1 including the first coupling layer PAL1 and the first protective layer PPL1 may be different from the second thickness PMT2 of the second protective layer PPL2. The first thickness PMT1 of the first protective member PM1 including the first coupling layer PAL1 and the first protective layer PPL1 may be greater than the second thickness PMT2 of the second protective layer PPL2.

As shown in FIGS. 7A and 7C, in the case where the second protective member PM2 includes only the second coupling layer PAL2 and the second protective layer PPL2, the first thickness PMT1 of the first protective member PM1 including the first coupling layer PAL1 and the first protective layer PPL1 may be different from the second thickness PMT2 of the second protective member PM2 including the second coupling layer PAL2 and the second protective layer PPL2. The first thickness PMT1 of the first protective member PM1 including the first coupling layer PAL1 and the first protective layer PPL1 may be greater than the second thickness PMT2 of the second protective member PM2 including the second coupling layer PAL2 and the second protective layer PPL2. In an embodiment, the first coupling layer PAL1 and the second coupling layer PAL2 may have substantially the same thickness as each other, and the thickness of the first protective layer PPL1 may be greater than the thickness of the second protective layer PPL2. In the disclosure, the expression "the thicknesses are substantially the same" not only means a case that the thicknesses of the components are the same as each other but also means a case that the thicknesses of the components are the same as each other within a range including differences that may occur due to fabrication errors in spite of the same design.

In the display device DD, the first protective member PM1 and the second protective member PM2 may include different materials from each other. In the display device DD, the first protective member PM1 overlapping the first area AA1 in which the driving circuit DIC (refer to FIG. 3) is disposed may include a material that is less deformed by an out lead bonding ("OLB") process, and the second protective member PM2 overlapping the second area AA2 including the folding area FAO (refer to FIG. 3) may include a material advantageous to the folding operation.

By the embodiments shown in FIGS. 7A to 7D, the first protective layer PPL1 and the second protective layer PPL2 may include different materials from each other. The material included in the first protective layer PPL1 may be polyethylene terephthalate ("PET"). The material included in the second protective layer PPL2 may correspond to polymer or metal, however, it should not be limited thereto or thereby as long as the material is advantageous for the folding operation.

The second protective layer PPL2 may have a modulus smaller than a modulus of the first protective layer PPL1. In an embodiment, the modulus of the second protective layer PPL2 may be equal to or greater than about 3 Gpa and equal to or smaller than about 6 Gpa. The second protective layer PPL2 may have a glass transition temperature higher than a glass transition temperature of the first protective layer PPL1. The glass transition temperature of the second protective layer PPL2 may be equal to or greater than about 90 degrees Celsius (° C.) and equal to or smaller than about 300° C. As the second protective layer PPL2 has the modulus lower than that of the first protective layer PPL1 and the glass transition temperature higher than that of the first protective layer PPL1, it is advantageous to bend or fold the display panel DP of the second area AA2, a stress applied to the second protective layer PPL2 may be reduced, and a manufacturing cost of the display device DD may be reduced.

In the display module DM shown in FIG. 7C, the first coupling layer PAL1 and the second coupling layer PAL2 may include different materials from each other. The first coupling layer PAL1 and the second coupling layer PAL2 may include a polymer resin, a heat curable resin, or a photocurable resin. The first coupling layer PAL1 and the second coupling layer PAL2 may include a silicon-based resin or an acrylic-based resin. The first coupling layer PAL1 may be the PSA film. The first coupling layer PAL1 may be the PSA film having property which is changed by an ultraviolet ("UV") ray. The first coupling layer PAL1 may be the PSA film that is curable when exposed to the UV ray within a wavelength range from about 340 nanometers (nm) to about 350 nm. The first coupling layer PAL1 may be a UV pressure-sensitive adhesive film having property which is changed depending on a type and a capacity of an initiator and a curing agent. The second coupling layer PAL2 may include a PSA film or a conventional adhesive. The second coupling layer PAL2 may have a modulus smaller than a modulus of the first coupling layer PAL1.

The first protective member PM1 and the second protective member PM2 may be formed through different processes from each other. As the first and second protective members PM1 and PM2 are formed through different processes, the first protective member PM1 and the second protective member PM2 may include different materials and may have different thicknesses. Since the first protective member PM1 and the second protective member PM2 are formed through different processes from each other, the first protective member PM1 including the material advantageous to the OLB process may be disposed under the display panel DP in the first area AA1, and the second protective member PM2 including the material advantageous to the folding operation may be disposed under the display panel DP in the second area AA2 in the display device.

Hereinafter, a manufacturing method of the display device DD will be described in detail with reference to FIGS. 8A, 8B, and 9A to 9D.

Figure 8A:
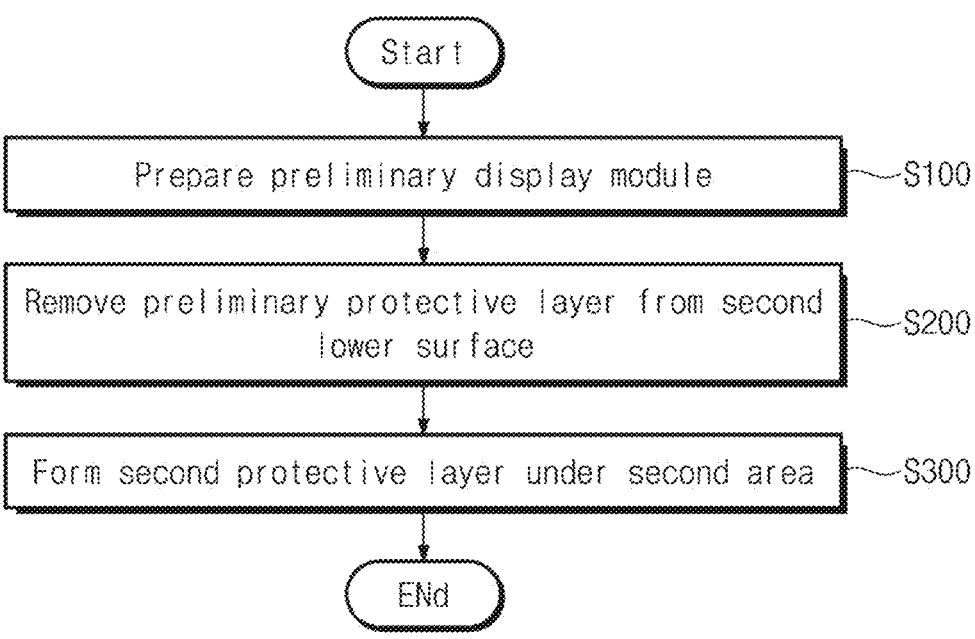
FIGS. 8A and 8B are flowcharts of an embodiment of a method of manufacturing a display device according to the disclosure.
Figure 8B:
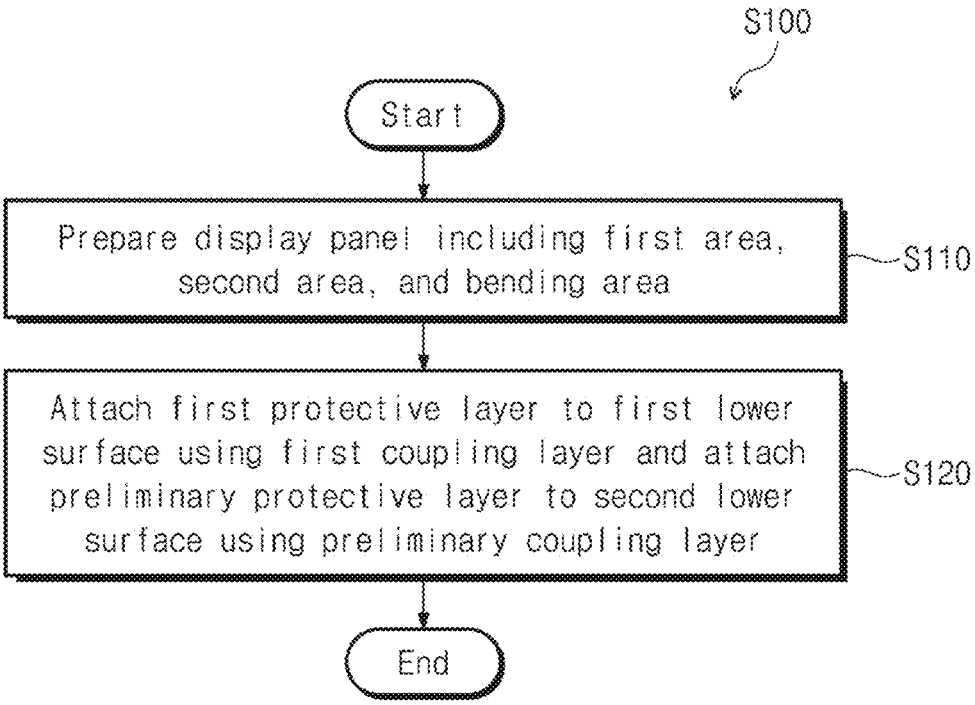

FIG. 8A is a flowchart showing an embodiment of some processes of the manufacturing method of the display device according to the disclosure. FIG. 8B is a flowchart showing an embodiment of a process of preparing a preliminary display module of the manufacturing method of the display device according to the disclosure. In the following descriptions of the manufacturing method of the display device, the same reference numerals denote the same elements described above, and thus, detailed descriptions of the same elements will be omitted.

Referring to FIG. 8A, the manufacturing method of the display device DD may include preparing a preliminary display module DM-P (referring to FIG. 9A) (S100), removing a preliminary protective layer SPL (referring to FIG. 9A) from the second lower surface US2 (referring to FIG. 9A) (S200), and forming the second protective layer PPL2 (referring to FIG. 9C) under the second area AA2 (referring to FIG. 9C) (S300).

Referring to FIG. 8B, the preparing of the preliminary display module DM-P (referring to FIG. 9A) (S100) may include preparing the display panel DP (referring to FIG. 9A) including the first area AA1 (referring to FIG. 9A), the second area AA2 (referring to FIG. 9A), and the bending area BA (referring to FIG. 9A) (S110) and attaching the first protective layer PPL1 (referring to FIG. 9A) to the first lower surface US1 (referring to FIG. 9A) using the first coupling layer PAL1 (referring to FIG. 9A) and the preliminary protective layer SPL (referring to FIG. 9A) to the second lower surface US2 (referring to FIG. 9A) using a preliminary coupling layer SAL (referring to FIG. 9A) (S120).

Figure 9A:
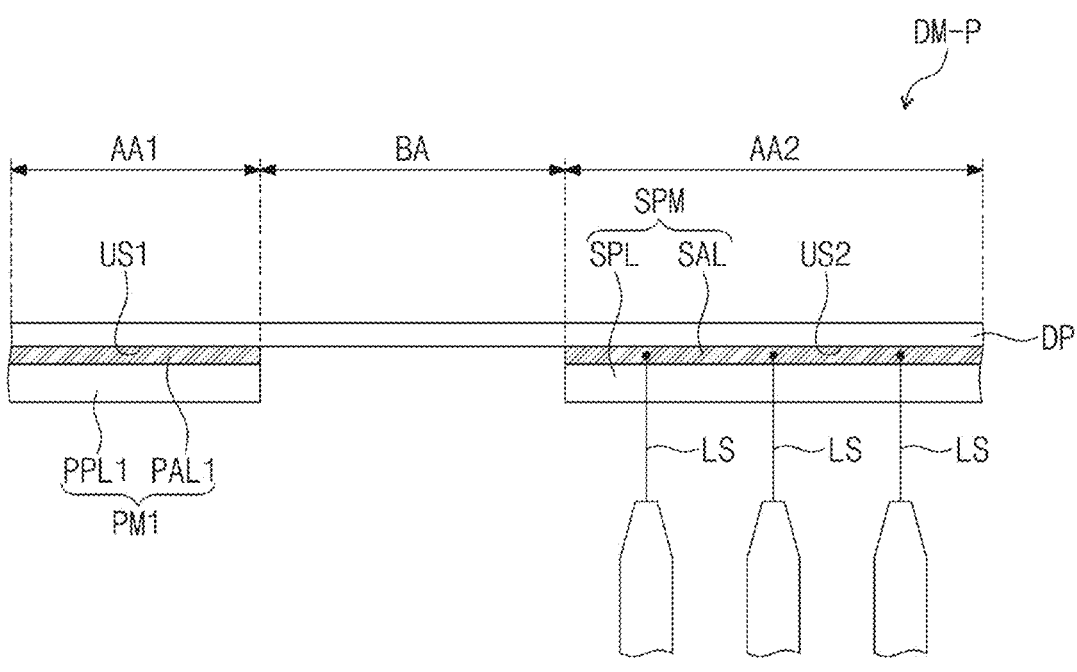
FIGS. 9A to 9C are views of a method of manufacturing an embodiment of a display device according to the disclosure.
Figure 9B:
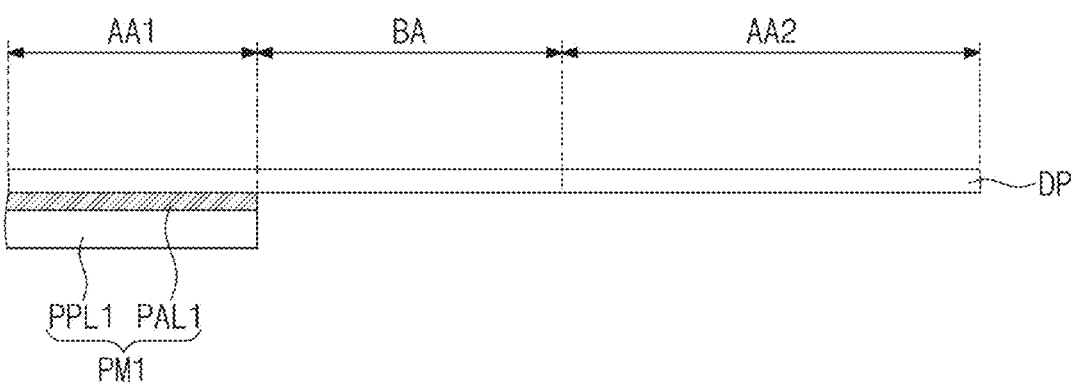
Figure 9C:
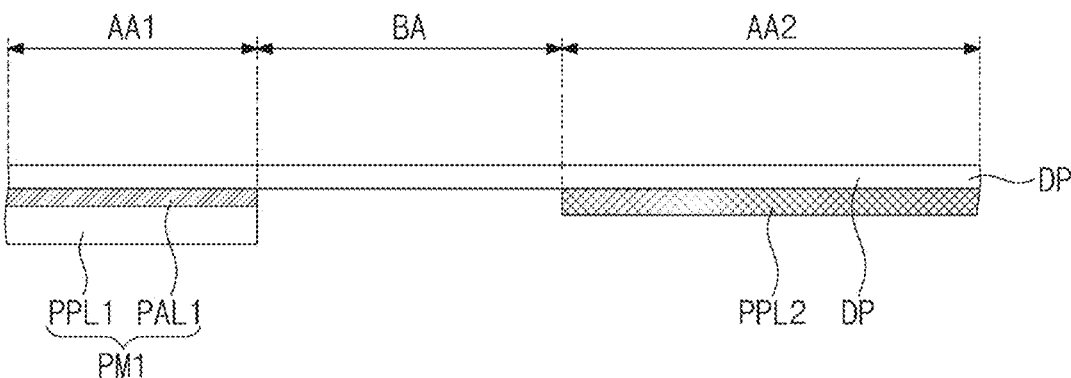

FIGS. 9A to 9C are views of an embodiment of the manufacturing method of the display device according to the disclosure.

Referring to FIG. 9A, the manufacturing method of the display device may include the preparing of the preliminary display module DM-P. The preliminary display module DM-P may include the display panel DP, the first protective member PM1 disposed on the first lower surface US1 of the display panel DP and including the first coupling layer PAL1 and the first protective layer PPL1, and a preliminary protective member SPM disposed on the second lower surface US2 and including the preliminary coupling layer SAL and the preliminary protective layer SPL. The preliminary coupling layer SAL may be disposed between the display panel DP and the preliminary protective layer SPL, and the preliminary protective layer SPL may be attached to the display panel DP by the preliminary coupling layer SAL.

The preliminary protective layer SPL may include the same material as that of the first protective layer PPL1 of the first protective member PM1. In an embodiment, the preliminary protective layer SPL may include a first material, the first protective layer PPL1 may include a third material, and the first material may be substantially the same as the third material. The preliminary protective layer SPL may have substantially the same thickness as the thickness of the first protective layer PPL1 of the first protective member PM1. The preliminary coupling layer SAL may include the same material as that of the first coupling layer PAL1 of the first protective member PM1. The preliminary coupling layer SAL may have substantially the same thickness as the thickness of the first coupling layer PAL1 of the first protective member PM1. In the preparing of the preliminary display module DM-P, the preliminary protective member SPM and the first protective member PM1 may be formed on the lower surface of the display panel DP through the same process. In the illustrated embodiment, the preliminary protective member SPM and the first protective member PM1 may correspond to portions of a single protective member that is patterned by removing a portion overlapping the bending area BA.

The preliminary coupling layer SAL may be the PSA film. The preliminary coupling layer SAL may include a polymer resin, a heat curable resin, or a photocurable resin. The preliminary coupling layer SAL may be the PSA film having property which is changed by a UV ray. The preliminary coupling layer SAL may be the PSA film that is curable when exposed to the UV ray within a wavelength range from about 340 nm to about 350 nm. The preliminary coupling layer SAL may be a UV pressure-sensitive adhesive film having property which is changed depending on a type and a capacity of an initiator and a curing agent.

In the preparing of the preliminary display module DM-P, the preliminary coupling layer SAL may have an adhesion equal to or greater than about 300 grams force per inch (gf/inch) and equal to or smaller than about 1000 gf/inch with respect to the second lower surface US2. As the preliminary coupling layer SAL has the adhesion in the above-mentioned range with respect to the second lower surface US2 in the preparing of the preliminary coupling layer SAL, the preliminary protective layer SPL may not be separated from the lower surface of the display panel DP in the processes of forming upper components, and thus, components included in the display panel DP may be protected from pressure applied thereto during the processes.

Although not shown in drawing figures, the preliminary display module DM-P may be transferred in a state where a release film is attached to the lower surface of the preliminary protective layer SPL and the first protective layer PPL1 in the manufacturing method of the display device. The release film may protect the preliminary protective layer SPL and the first protective layer PPL1. After the release film attached to the lower surface of the preliminary protective layer SPL and the first protective layer PPL1 is removed, a light LS may be irradiated to the preliminary coupling layer SAL.

Referring to FIGS. 9A and 9B, the manufacturing method of the display device DD may include irradiating the light LS to the preliminary coupling layer SAL to remove the preliminary protective layer SPL from the second lower surface US2.

The light LS may be irradiated in the form of a lamp or a laser beam. The light LS may be irradiated to the preliminary coupling layer SAL through the preliminary protective layer SPL. The light LS may be directly irradiated to the preliminary coupling layer SAL. The light LS may be a light within a wavelength corresponding to the UV ray. The light LS may have the wavelength from about 340 nm to about 350 nm.

As the light LS is irradiated to the preliminary coupling layer SAL, the preliminary coupling layer SAL may be cured. Referring to FIG. 9B, as the preliminary coupling layer SAL is cured, an adhesive function of the preliminary coupling layer SAL may be lost, and thus, the preliminary protective layer SPL may be removed from the display panel DP. After the preliminary coupling layer SAL is cured by the light LS and the preliminary protective layer SPL is removed, no layer or member may be placed on the second lower surface US2.

In the removing of the preliminary protective layer SPL from the second lower surface US2, the preliminary coupling layer SAL may have an adhesion equal to or greater than about 1 gf/inch and equal to or smaller than about 20 gf/inch with respect to the second lower surface US2. Since the preliminary coupling layer SAL has the adhesion in the above-mentioned range with respect to the second lower surface US2 after the light LS is irradiated, the preliminary protective layer SPL may be easily removed from the second lower surface US2.

Referring to FIG. 9C, the manufacturing method of the display device DD may include forming the second protective layer PPL2 under the display panel DP in the second area AA2.

The second protective layer PPL2 may be directly formed on the lower surface of the display panel DP without using a separate adhesive layer in second area AA2, however, it should not be limited thereto or thereby. In an embodiment, in the forming of the second protective layer PPL2 of the manufacturing method of the display device, the second protective layer PPL2 may be attached to the lower surface of the display panel DP by the second coupling layer PAL2 (refer to FIG. 7C) in the second area AA2 as described with reference to FIG. 7C.

Referring to FIGS. 9A to 9C, the second protective layer PPL2 formed under the display panel DP in the second area AA2 may include a material different from that of the preliminary protective layer SPL. The second protective layer PPL2 may include a material different from that of the first protective layer PPL1. The preliminary protective layer SPL may include the first material, the second protective layer PPL2 may include a second material, and the first material may be different from the second material. The first protective layer PPL1 may include the third material, and the second material may be different from the third material.

As shown in FIG. 7C, in the case where the second protective layer PPL2 is attached to the lower surface of the display panel DP by the second coupling layer PAL2 (refer to FIG. 7C) in the second area AA2, the second coupling layer PAL2 (refer to FIG. 7C) may include a material different from that of the preliminary coupling layer SAL. The second coupling layer PAL2 (refer to FIG. 7C) may include a material different from that of the first coupling layer PAL1.

Although not shown in drawing figures, the second protective layer PPL2 may be formed under the display panel DP in the second area AA2 as shown in FIG. 7D while being attached to an upper surface of the support member SM (refer to FIG. 7D). In an embodiment, the second protective layer PPL2 may be attached to the lower surface of the display panel DP in the second area AA2 while being attached to the upper surface of the support member SM by the fourth adhesive layer AL4 (refer to FIG. 6B).

According to the manufacturing method of the display device, instead of forming the first protective layer PPL1 included in the first protective member PM1 and the second protective layer PPL2 with different materials or different thicknesses in the preparing of the preliminary display module, the process of replacing the preliminary protective layer SPL overlapping the second area AA2 with the second protective layer PPL2 may be carried out after other processes are performed. Accordingly, even though the first protective member PM1 and the second protective layer PPL2 are formed with different materials or different thicknesses, a process efficiency may not be lowered.

According to a conventional display device, a panel protective member protecting a display panel is formed on a lower surface of the display panel. In accordance with the trend of bending or folding the display panel in the display area, it is attempted to replace a material of the panel protective member with a flexible material, which is easy to bend and leaves no folding marks. However, when the material of the panel protective member is replaced with the flexible material, a stress increases during the OLB process of the non-display area. In order to solve the issues described above, a process of forming the panel protective member in the display area and the panel protective member in the non-display area using different materials is considered when the panel protective member is formed, however, the process efficiency is lowered due to manufacturing tolerances, and a manufacturing cost increases.

According to the display device of the disclosure, the panel protective member in the display area and the panel protective member in the other area may include different materials from each other and may have different thicknesses from each other, and thus, the display device may have the structure that is easy to bend, reduces the manufacturing cost, and is advantageous for the OLB process. According to the manufacturing method of the display device, the panel protective member of the display area and the panel protective member of the non-display area include the same material in a preceding process such as the OLB process of the non-display area or a FAB process that forms the upper components on the display panel. That is, the panel protective member of the display area and the panel protective member of the non-display area are formed with the same material and the same thickness on the lower surface of the display panel in the preceding process, and then the material of the panel protective member formed in the display area is replaced with the flexible material in a subsequent process. Accordingly, the process efficiency may be prevented from being lowered due to the manufacturing tolerances. Therefore, the reduction in process efficiency may be prevented, and the panel protective member of the display area and the panel protective member of the non-display area may be formed with different materials and different thicknesses in the completed display device. Thus, the display device including the panel protective member of the display area that is easily bent and the panel protective member of the non-display area that is not deformed after the OLB process may be manufactured.

Although the embodiments of the disclosure have been described, it is understood that the disclosure should not be limited to these embodiments but various changes and modifications may be made by one ordinary skilled in the art within the spirit and scope of the disclosure as hereinafter claimed. Therefore, the disclosed subject matter should not be limited to any single embodiment described herein, and the scope of the disclosure shall be determined according to the attached claims.

What is claimed is:

1. A display device comprising:
    a display panel comprising a first area, a second area comprising a display area, and a bending area disposed between the first area and the second area and having a predetermined radius of curvature;

a first protective member comprising a first coupling layer directly disposed on a first surface of the display panel in the first area and a first protective layer disposed on the first coupling layer; and a second protective member directly disposed on the first surface of the display panel in the second area, wherein the first protective member has a first thickness different from a second thickness of the second protective member.

2. The display device of claim 1, wherein the first thickness is greater than the second thickness.

3. The display device of claim 1, wherein the second protective member comprises a material different from a material of the first protective member.

4. The display device of claim 1, further comprising a support member disposed under the second protective member.

5. The display device of claim 1, further comprising a driving circuit disposed in the first area of the display panel.

6. The display device of claim 1, wherein the first protective layer comprises polyethylene terephthalate.

7. The display device of claim 1, wherein the first coupling layer comprises a pressure sensitive adhesive.

8. The display device of claim 1, wherein the second protective member comprises a second protective layer disposed under the display panel in the second area.

9. The display device of claim 8, wherein the second protective layer comprises a material different from a material of the first protective layer.

10. The display device of claim 8, wherein the second protective layer has a modulus smaller than a modulus of the first protective layer.

11. A display device comprising:

a display panel comprising a first area, a second area comprising a display area, and a bending area disposed between the first area and the second area and having a predetermined radius of curvature;

a first protective member comprising a first coupling layer disposed under the display panel in the first area and a first protective layer disposed under the first coupling layer; and a second protective member disposed under the display panel in the second area, wherein the first protective member has a first thickness different from a second thickness of the second protective member, wherein the second protective member comprises:

a second coupling layer disposed under the display panel in the second area; and a second protective layer disposed under the second coupling layer.

12. The display device of claim 11, wherein the second coupling layer comprises a material different from a material of the first coupling layer.

13. The display device of claim 11, wherein the second coupling layer comprises a pressure sensitive adhesive.

* * * * *